US006759680B1

(12) United States Patent
Takemura

(10) Patent No.: US 6,759,680 B1
(45) Date of Patent: *Jul. 6, 2004

(54) DISPLAY DEVICE HAVING THIN FILM TRANSISTORS

(75) Inventor: Yasuhiko Takemura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/453,402

(22) Filed: Dec. 3, 1999

Related U.S. Application Data

(62) Division of application No. 08/978,597, filed on Nov. 26, 1997, now Pat. No. 6,023,308, which is a division of application No. 08/419,956, filed on Apr. 10, 1995, now Pat. No. 5,828,429, which is a continuation of application No. 07/959,918, filed on Oct. 14, 1992, now abandoned.

(30) Foreign Application Priority Data

Oct. 16, 1991 (JP) .............................................. 3-296331

(51) Int. Cl.$^7$ ........................................... H01L 29/786
(52) U.S. Cl. .......................................... 257/72; 257/66
(58) Field of Search ...................................... 257/66, 72

(56) References Cited

U.S. PATENT DOCUMENTS 3,885,196 A   5/1975   Fischer
4,006,383 A   2/1977   Luo et al.

(List continued on next page.)

FOREIGN PATENT DOCUMENTS

DE    0265973    3/1999
EP    0 414 478  2/1991

(List continued on next page.)

OTHER PUBLICATIONS

Pending Claims of U.S. patent application Ser. No. 09/342,236 as of Dec. 12, 2002.
U.S. patent application Ser. No. 09/342,235, including specification, drawings, filing receipt and pending claims, "Electro–optical Device and Method of Driving and Manufacturing the Same," Yasuhiko Takemura, filed Jun. 29, 1999.
Inventor: Yasuhiko Takemura, Specification and Drawings for U.S. patent application Ser. No. 09/843,710, Filed: Apr. 30, 2001, 66 Pages, "Electro–Optical Device and Method of Driving and Manufacturing the Same".
IBM Technical Disclosure Bulletin, vol. 24, No. 7B (Dec., 1981) pp. 3678–3680, "AC Drive Circuit for an Integrated Liquid Crystal–Silicon Display".
Final Official Action, Paper No. 27, U.S. patent application Ser. No. 09/342,235, filed Jun. 29, 1999, Yasuhiko Takemura, date mailed May, 20, 2003.

Primary Examiner—Jerome Jackson, Jr.
(74) Attorney, Agent, or Firm—Eric J. Robinson; Robinson Intellectual Property Law Office, P.C.

(57) ABSTRACT

A semiconductor device with a substrate having an insulating surface, a first signal line extending over the substrate, a first thin film transistor having a channel region with crystalline silicon formed over the substrate and a gate of the first thin film transistor is connected to the first signal line, a second signal line extending across the first signal line, a second thin film transistor having a channel region comprising crystalline silicon formed over the substrate and a signal applied to a gate of the second thin film transistor from the second signal line through at least the first thin film transistor, a voltage supply line formed over the substrate, a pixel electrode formed over the substrate and the pixel electrode is supplied with a voltage from the voltage supply line through at least the second thin film transistor, and a driving circuit formed over the substrate for driving at least one of the first and second thin film transistors, the driving circuit having a third thin film transistor wherein a channel forming region of the third thin film transistor comprises crystalline silicon.

19 Claims, 15 Drawing Sheets

U.S. PATENT DOCUMENTS

| | | | |
|---|---|---|---|
| 4,042,854 A | 8/1977 | Luo et al. |
| 4,461,071 A | 7/1984 | Poleshuk |
| 4,528,480 A | 7/1985 | Unagami et al. |
| 4,532,506 A | 7/1985 | Kitazima et al. |
| 4,602,192 A | 7/1986 | Nomura et al. |
| 5,042,916 A | 8/1991 | Ukai et al. |
| 5,051,570 A | 9/1991 | Tsujikawa et al. |
| 5,161,237 A | 11/1992 | Hartman et al. |
| 5,193,018 A | 3/1993 | Wu |
| 5,194,974 A | 3/1993 | Hamada et al. |
| 5,250,931 A | 10/1993 | Misawa et al. |
| 5,289,030 A | 2/1994 | Yamazaki et al. |
| 5,302,966 A | 4/1994 | Stewart |
| 5,308,998 A | 5/1994 | Yamazaki et al. |
| 5,326,991 A | 7/1994 | Takasu |
| 5,349,366 A | 9/1994 | Yamazaki et al. |
| 5,365,080 A | 11/1994 | Yamazaki et al. |
| 5,426,526 A | 6/1995 | Yamamoto et al. |
| 5,828,429 A | 10/1998 | Takemura |
| 5,905,555 A | 5/1999 | Yamazaki et al. |
| 5,930,608 A | 7/1999 | Yamazaki et al. |
| 6,023,308 A | 2/2000 | Takemura |
| 6,352,883 B1 | 3/2002 | Yamazaki et al. |
| 2002/0090770 A1 | 7/2002 | Yamazaki et al. |

FOREIGN PATENT DOCUMENTS

| | | |
|---|---|---|
| EP | 0 342 925 | 12/1994 |
| JP | 53-144297 | 12/1978 |
| JP | 56-043679 | 4/1981 |
| JP | 57-169795 | 10/1982 |
| JP | 58-004180 | 1/1983 |
| JP | 58-115850 | 7/1983 |
| JP | 60-123896 | 7/1985 |
| JP | 61-267734 | 11/1986 |
| JP | 61-295664 | 12/1986 |
| JP | 62-145289 | 6/1987 |
| JP | 62-120354 | 7/1987 |
| JP | 62-204575 | 9/1987 |
| JP | 63-104026 | 5/1988 |
| JP | 63-119268 | 5/1988 |
| JP | 64-031466 | 2/1989 |
| JP | 01-130133 | 5/1989 |
| JP | 01-156725 | 6/1989 |
| JP | 01-165172 | 6/1989 |
| JP | 01-055460 | 11/1989 |
| JP | 01-289917 | 11/1989 |
| JP | 02-223913 | 6/1990 |
| JP | 02-177443 | 7/1990 |
| JP | 02-198428 | 8/1990 |
| JP | 02-211428 | 8/1990 |
| JP | 02-234134 | 9/1990 |
| JP | 02-272521 | 11/1990 |
| JP | 3-77915 | 4/1991 |
| JP | 3-077922 | 4/1991 |
| JP | 03-229221 | 10/1991 |
| JP | 03-259123 | 11/1991 |
| JP | 04-267563 | 9/1992 |

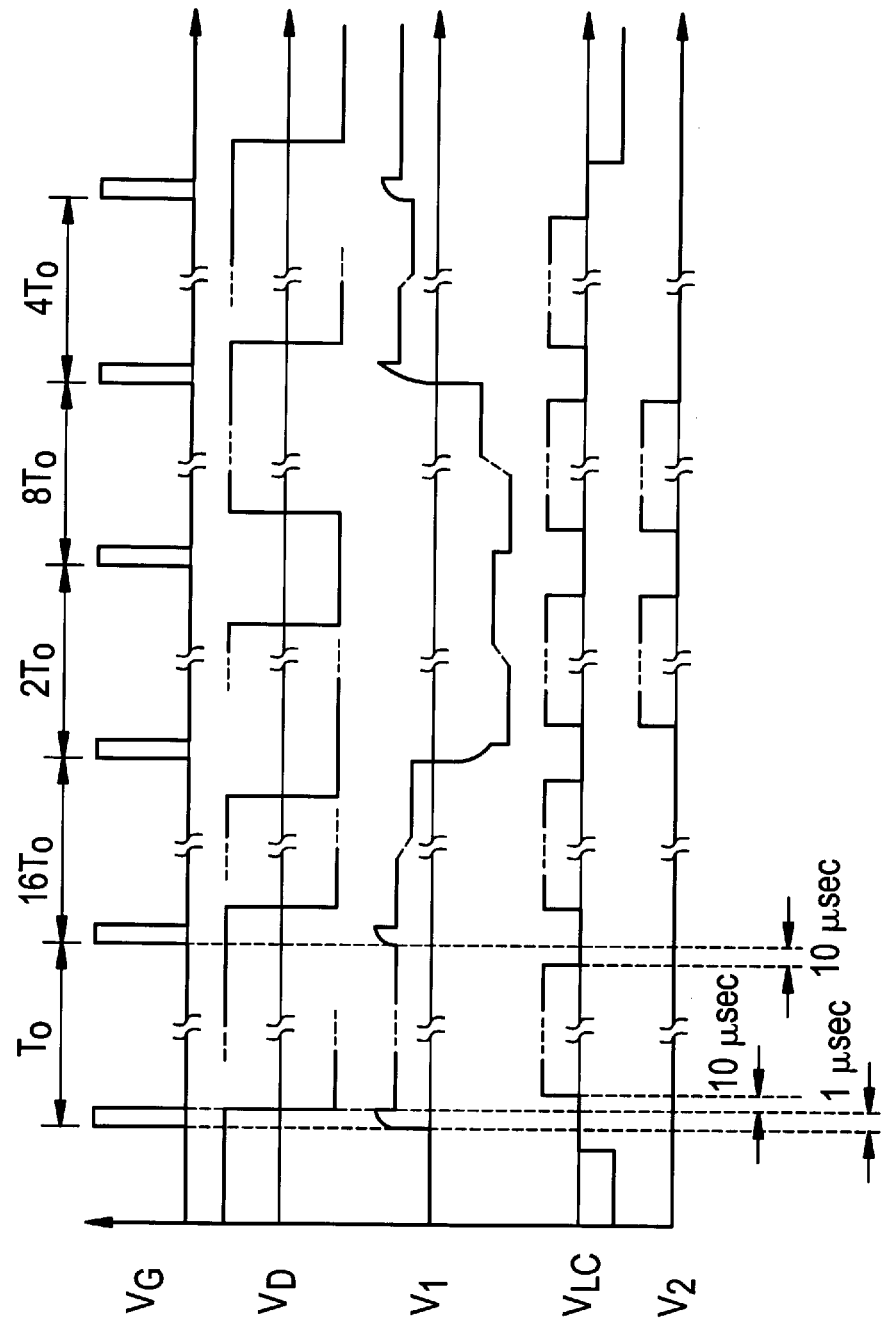

DISPLAY DEVICE HAVING THIN FILM TRANSISTORS

This application is a Divisional of application Ser. No. 08/978,597 filed Nov. 26, 1997 U.S. Pat. No. 6,023,308; which itself is a Division of application of Ser. No. 08/419,956 filed Apr. 10, 1995, now U.S. Pat. No. 5,828,429; which is a Continuation of application Ser. No. 07/959,918 filed Oct. 14, 1992 abandoned.

BACKGROUND OF THE INVENTION

1. Field of the Invention

The present invention relates in general to an electro-optical liquid crystal display suitable for finely graded operation and methods of driving and manufacturing the same.

2. Description of the Prior Art

Recently, thin film transistor liquid crystal displays (TFTLCD for short) have been increasingly broadly utilized, along with the development of color liquid crystal displays, rather than simple matrix type liquid crystal displays because the former type is particularly excellent in terms of brightness, contrast and wide view angles.

FIG. 1(A) is a circuit diagram showing a driving circuit for controlling one pixel of such a TFTLCD. As shown in the figure, a single thin film transistor is provided for the pixel located at each intersection of a matrix diagonal wiring comprising horizontal addressing lines (only one line $V_G$ being illustrated) and vertical data lines (also only one line $V_D$ being illustrated). The drain (D) of the transistor is connected to the corresponding one of the data lines while the source (S) thereof is connected to the corresponding one of the electrode pads defining pixels of the display (not shown). The gate of the transistor is connected to the corresponding one of the addressing lines $V_G$. Such a matrix type design has been broadly employed already in the DRAM technique so that the reliability thereof is believed to have been fully established. In the case of the driving technique for liquid crystal display, however, there remain still several problems to be solved since the operation of liquid crystal displays includes also analog data manipulation.

FIG. 1(B) is a schematic diagram showing examples of signals applied to the addressing line $V_G$ and the data line $V_D$ and the resultant driving voltage at the electrode of the corresponding pixel in response to the signals. If a liquid crystal material is subjected to a DC voltage for a substantial time period, the characteristics of the materials are degraded. The signal at the data line therefore is periodically inverted (usually for each frame) in order to invert the direction of the voltage applied across the liquid crystal material.

The mechanism of the operation of the pixel is next explained. When a voltage pulse is applied to the gate, the transistor is turned on in order to transmit electric charge to the electrode pad of the pixel from the data line being at a high level so that the voltage level of the electrode pad is increased (region $t_1$). The increase, however, is not so fast. In the case the transistor is made of an amorphous silicon semiconductor, the mobility of carriers is so low that the pulse applied to the gate is sometimes removed and the transistor is turned off before the voltage at the pixel reaches to the necessary level. In the case that the transistor is made of polysilicon, such undesirable situation is substantially improved. If the operational speed is so high that the pulse width is narrower than one microseconds, however, even the polysilicon transistor can no longer follow such a high speed. It takes 30 milliseconds in usual cases to scan one frame. The pulse width of the addressing signal is therefore about 50 microseconds in the case that the number of the addressing lines is 480 (480 rows display). If higher definition of grading is desired, however, the pulse width narrower than one microsecond becomes necessary.

The voltage at the pixel then drops by "V. This drop, called "rebound", is caused by charge accumulated in the parasitic capacitance which is formed by the overlap between the gate electrode and the source region. The voltage drop increases as the parasitic capacitance increases. In the case of displays utilizing amorphous TFTs, a capacitance is provided across the liquid crystal at the pixel in order to reduce the voltage drop. The provision of such a particular capacitance, in turn, increases the load of the TFT and the other peripheral circuit and decreases the aperture ratio because of the wiring for the capacitances so that the brightness is decreased.

In the case of polysilicon transistors, such a problem of the voltage drop is not so significant since the self-alignment process can be employed for forming the gate electrode and the source and drain regions. The voltage drop, however, still exists as high as one volts which may become a substantial problem in future when a higher definition is required.

The voltage at the pixel gradually decreases until a next addressing pulse arrives (region $t_2$) because of discharge due mainly to leakage current passing through the transistor being turned off. The next pulse is then applied to the addressing line $V_G$. Since the voltage level of the pulse is inverted in this time, the voltage level at the pixel is also gradually decreased to the inverted level in the same manner as described above.

When the addressing pulse is removed from the addressing line, the absolute value of the voltage at the pixel is increased in this case by the voltage drop "V followed by gradually decrease due to discharge. As understood from the illustration, the voltage applied to the pixel is asymmetrical resulting in several problems such as flicker or deterioration of the liquid crystal material.

Furthermore, it is to be noted that the voltage at the pixel having a waveform of such a complicated pattern substantially tends to vary from pixel to pixel. For example, the rise of the voltage at the pixel in region t1 depends upon the several parameters of the transistor, e.g. the mobility, the channel length, the thickness of the active region, the gate voltage (the voltage applied to the addressing line) and the drain voltage (the voltage applied to the data line). The mobility of the transistor depends largely upon the manufacturing process so that pixel to pixel variation will not be so large. When the panel size becomes large in future, however, it will be the case that the variation within the same panel can not be neglected. Variation in the thickness of the active region may be also a problem in the case of large panels. Variations in the channel length and the channel width are usually as large as about 10% of more from pixels near the driver to pixels apart from the driver.

The voltage drop depends upon the parasitic capacitance of the TFT. The dispersion of the capacitance is about 20% in the case of non-self alignment processes and about 10% in the case of self-alignment processes. Furthermore, since the voltage drop is in proportion to the gate voltage applied, the dispersion of the parasitic capacitance and the dispersion of the gate voltage form a multiplier action to widen the dispersion of the voltage drop.

On the other hand, the gradually decrease of the voltage at the pixel depends largely upon the channel length, the channel width, the characteristics of the active region, of the transistor (TFT). As a result, the voltage level at the pixel fluctuates from solid line to broken line in FIG. 1(B). Particularly accurate quality control is required in manufacturing processes for the devices in order that the dispersion of the voltage at the pixel is always within a tolerable range. As a result, the yield is significantly decreased. It may be impossible to meet future requirements for highly-value-added products with a high yield whereas low quality products may be manufactured with a relatively high yield.

At the present time, a plurality of grades in brightness can be constructed by controlling the voltages at the signals lines. The manufacture of the graded displays seems to be almost impossible even with 16 grades in accordance with the current technique from the view point as discussed below. The threshold voltages of usual twisted nematic liquid crystals are 5 V or therearound, which are divided by 16 into 30 mV for realizing 16 grades. Considering dispersion in the voltage rise at time $t_1$, in the voltage drop and in the discharge, as above discussed, the dispersion of the voltage at the pixel would easily exceed 300 mV unless products are carefully sifted out.

From the above view point, the inventors have advocated digital graded displaying systems in place of analog grading systems. The digital grading are realized by controlling the time for which the liquid crystal is subjected to a driving voltage at each pixel. Details are described in Japanese Patent Applications Nos. Hei3-169305, 169306, 169307 and 209869 of the same applicant. The frequencies required for driving the digital grading displays, however, are 20 to 300 times as high as conventional frequencies so that TFTs of CMOS structure have to be arranged at each pixel in place of NMOSTFT alone. It is also difficult even with such digital systems to suppress disturbance of grading due to dispersion of the characteristics of the TFTs.

For example, when an intermediate grade is selected by limiting the voltage application time only to 45% of one frame, 110% of the predetermined voltage level may be applied to certain pixels whereas 90% of the level may be applied to other pixels, in which case the display incurs 20% or wider dispersion of the driving voltage since 1.1×45% =49.5% in the former pixels and 0.9×45%=40.5% in the later pixels. In this case, only 8 grades seems to be possible.

In order to solve this problem, as described in Japanese Patent Application No. Hei3-209870, the inventors proposed for the driving device to collect information about characteristics of respective pixels and input the information into an external memory device. The input data signal are processed in advance on the basis of the information and outputted to the respective pixels in order to make correction. The data processing, however, is so complicated that peripheral circuits must carry heavy burdens. Furthermore, it takes a substantial time to examine the respective pixels and input correction data. For example, if the examination and the data input for one pixel takes one second, the total time of 85 hours is necessary in the case of a panel having 640×480 pixels resulting in a significantly increased cost.

BRIEF SUMMARY OF THE INVENTION

It is an object of the present invention to provide an electro-optical device (liquid crystal display) suitable for digital grading.

It is another object of the present invention to provide a method of driving an electro-optical device (liquid crystal display) suitable for digital grading.

It is a further object of the present invention to provide a method of manufacturing an electro-optical device (liquid crystal display) with a high yield.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, in an electro-optical liquid crystal display having a first substrate on which a plurality of electrode pads are formed in order to define a plurality of pixels arranged in a matrix, a second substrate on which an opposed electrode arrangement is formed, an electro-optical modulating layer (liquid crystal layer) disposed between the first and second substrates, and a control circuit for supplying driving voltages to the electrode pads respectively, the control circuit comprises a plurality of addressing lines for scanning the pixels by sequentially supplying an addressing signal to the pixels arranged in each row of matrix to be addressed, a plurality of data lines for supplying data to the pixels arranged in the row addressed by the addressing signal, a plurality of voltage supplying lines for supplying a driving signal to the pixels arranged in the row addressed by the addressing signal and means for selectively connecting or disconnecting the electrode pad of each pixel with a corresponding one of the voltage supplying line in accordance with data supplied from the data lines when that pixel is addressed by the addressing signal. Particularly, the means comprises a plurality of second transistors provided respectively for the plurality of the pixels, each second transistor being connected between a corresponding one of the electrode pads and a corresponding one of the voltage supplying lines and a plurality of first transistors provided for the plurality of the pixels respectively, each first transistor being connected between the gate of a corresponding one of said second transistors and a corresponding one of said data lines, the gate of said first transistor being connected to a corresponding one of said addressing line.

The electro-optical liquid crystal display in accordance with the present invention is particularly suitable for displaying finely graded images. The plurality of pixels are arranged in a matrix and supplied with data signals through the data lines extending in the column direction. Extending in the row direction are a plurality of the addressing lines and a plurality of the voltage signal lines. Each row is selected by activating each of the addressing lines and supplied with a driving voltage from each of the voltage supplying lines.

Referring now to FIGS. 2(B) and 2(C), a typical example of a circuit for controlling each pixel of the liquid crystal display in accordance with the present invention will be briefly explained. FIG. 2(B) is a schematic circuit diagram showing one pixel of the liquid crystal display. FIG. 2(C) is a graphical diagram showing voltage levels appearing at respective nodes of the circuit diagram during operation. The display comprises a number of such pixels arranged in a matrix. A particular column can be made active by activating a corresponding one of the data lines $V_D$ whereas a particular row can be made active by suitably activating the corresponding addressing line $V_G$ and then the corresponding voltage supplying line $V_{LC}$.

The circuit for driving one pixel as shown in FIG. 2(B) comprises a first n type thin film transistor $Tr_1$ and a second n type thin film transistor $Tr_2$. The first transistor $Tr_1$ is connected with the data line $V_D$ at its drain, the addressing line $V_D$ at its gate and the gate of the second transistor $Tr_2$ at its source in order to transfer a voltage level at the data line $V_D$ to the gate of the second transistor $Tr_2$ when addressed by the addressing line $V_G$. The source and the drain of the second transistor $Tr_2$ are connected to the electrode pad of a liquid crystal LC and the voltage supplying line $V_{LC}$. The electrode pad is formed to define one pixel in the liquid crystal.

The circuit operates as follows. When addressed (given a positive gate signal from the addressing line $V_G$), the first transistor $Tr_1$ is turned on to transfer the data level at the data line $V_D$ to the gate of the second transistor $Tr_2$. If the data level is "1", the second transistor $Tr_2$ is turned on to supply the pixel with a voltage at the voltage supplying line $V_{LC}$ in order to activate the pixel. On the other hand, if the data level is "O", the second transistor $Tr_2$ is turned off. The voltage at the gate of the second transistor $Tr_2$ is maintained when the addressing voltage is removed from the addressing line $V_G$ to address subsequent rows.

In accordance with the above structure, the signal level at the respective data line is not directly transmitted to the pixel so that the timing of the signal operation is significantly relaxed. Namely, even if the voltage level at the respective data line deviates from the predetermined level, the pixel is supplied with a constant driving voltage as long as the deviating level can turn on the second transistor $Tr_2$.

Namely, as discussed above, the pulse width of the addressing signal is extremely short, e.g. 70 microseconds for typical cases, or from shorter than tenth to several-hundredth that of the typical cases for digital grading. The voltage level supplied to the respective pixel tends to fluctuate because of such a short operating time.

On the other hand, it is understood from analysis of the operation of the display in accordance with the present invention that even if the pulse width of an addressing signal applied to the first transistor $Tr_1$ is also very short resulting in variation of the resultant source voltage level, the source voltage is not directly transferred to the pixel but applied to the gate of the second transistor $Tr_2$ instead and therefore is enough as long as its lowest level can control the operation of the second transistor $Tr_2$.

If such conditions are satisfied, a constant voltage can be supplied to the respective pixels from the voltage supplying lines by controlling the on/off operation of the second transistors. Accordingly, the voltage supplied to each pixel is not dictated by the signals from the data lines. The signals from the data lines only determine the on/off condition of the second transistors.

Furthermore, it should be noted that the switching speed of the second transistors may be substantially lower than that of the first transistors. The second transistor can perform its task even if it operates after completion of the on/off operation of the first transistor since electric charge is trapped at the gate of the second transistor $Tr_2$ after operation of the first transistor. Accordingly, the second transistor can be an amorphous silicon semiconductors TFT having a slow switching speed even for digital grading with 32 grades.

Furthermore, the load upon the first transistor of FIG. 2(B) is significantly reduced as compared with that in conventional configurations. Prior to the present invention, electric charge must pass through the transistor addressed within a time shorter than 70 microseconds to the pixel. Electric charge passing through the first transistor of the present invention is accumulated in the capacitance formed between the gate and the drain of the second transistor $Tr_2$. For example, the capacitance associated with each pixel is 30 times as large as that of the capacitance formed between the gate and the drain of the second transistor $Tr_2$ in the case that the area and the thickness of the electrode pad of each pixel are 300 micrometers×300 micrometers and 6 micrometers respectively and the area and the thickness of the gate insulating film of the second transistor are 10 micrometers× 10 micrometers and 0.2 micrometers. The ratio between these capacitances is furthermore increased to 120 if the area of the gate electrode is decreased to 5 micrometers×5 micrometers.

It will be apparently understood that heavy loads are carried on the transistors in conventional cases. On the other hand, in accordance with the present invention, the load is decreased by a factor of 30 to 120 or more. This means that the switching speed of the first transistor can be substantially increased to 30 to 120 times that in the conventional cases in which digital grading can not be realized with amorphous transistor whose mobility is very low.

The electric charge to be passed through the first transistor, however, is significantly small in accordance with the present invention so that the above problem is not the case. Accordingly, it is possible to drive amorphous silicon TFTs even to realize 64 or more grades. Amorphous silicon TFTs can be produced at relatively low temperatures as compared with polysilicon TFTs, so that massproduction is facilitated to obtain a high yield and reduce the production cost.

The second transistor, on the other hand, can sufficiently perform its task if its switching speed is no lower than one hundredth, preferably no lower than twentieth, that of the first transistor. The amount of electric charge passing through the second transistor is substantially equal to that in conventional cases. Since the switching speed required of the second transistor is very low, however, amorphous silicon TFTs can be employed for digital grading with 32 grades. The switching speed of amorphous silicon TFTs is usually about 70 microseconds which is only 7% of the minimum cycle of the 32 grade digital grading, i.e. 32/32 milliseconds (about 1 millisecond), so that such higher grading can be realized with no problem.

The channel width can be increased for the purpose of increasing the driving capability of the transistor $Tr_2$. Care must be paid in this case because the capacitance between the gate and the drain of the second transistor $Tr_2$ is also increased resulting in a heavy load on the first transistor $Tr_1$. For example, if the channel width is increased by a factor of 5 to obtain 5 times the driving capability, the load on the first transistor $Tr_1$ is also increased by a factor of 5 so that the effective switching speed of the first transistor $Tr_1$ is reduced to 20%.

Referring to FIG. 2(C), a method of driving the liquid crystal display as illustrated in FIG. 2(B) will be described. The addressing line $V_G$ and the data line $V_D$ are supplied with similar signals as in a conventional display. The signal supplied through the data line, however, is a pure digital 0 or 1 which simply turns off or on the second transistor $Tr_2$. The voltage source line (voltage supplying line) $V_{LC}$ is supplied alternately with a positive signal or a negative signal in synchronism with the addressing signal on the corresponding addressing line $V_G$. The signal on the voltage supplying line, however, is set at O during the time when the addressing line is supplied with an addressing pulse. Reference letters $V_G$ to $V_2$ in FIG. 2(C) correspond to similar letters written in FIG. 2(B).

The voltage levels at respective nodes change during operation as follows. The voltage $V_1$ at the source of the first transistor $Tr_1$ (i.e. at the gate of the second transistor $Tr_2$) rises as solid line, then lightly drops responsive to disappearing of the addressing signal and gradually decreases due to discharge through the transistor $Tr_1$.

On the other hand, the voltage level at the source of the second transistor $Tr_2$ (i.e. at the electrode pad of the pixel) changes as follows. First, the second transistor $Tr_2$ is turned on since the source of the first transistor $Tr_1$ rises. Next, since a driving voltage is supplied to the voltage supplying line, the electrode pad is charged to a predetermined level. In this connection, it is noted that since the second transistor $Tr_2$ is already tuned on when the driving voltage is supplied, the charging time is dictated by the one resistance of the transistor $Tr_2$ and the capacitance associated with the electrode pad, resulting in a rapid onset.

The driving voltage is supplied to the voltage supplying line only when a certain time elapses after the addressing signal disappears. Of course, it is also possible to supply the driving voltage just after the addressing signal disappears. When finely grading is performed by means of high speed TFTs as the second transistor $Tr_2$ in accordance with the digital control technique, particularly such a technique as described in Japanese Patent Application Nos.Hei3-183870 to 183873, however, the later alternative timing is not so good.

For example, consider a digital grading with 64 grades. The minimum periodic cycle of the addressing signals is 500 microseconds. Although the pulse width of the addressing signal is about 1 microsecond in the case of a matrix having 480 rows, the first transistor $Tr_1$ can perform its task because of the light load thereon as explained above. There arises no problem, even if the source of the transistor $Tr_1$ rises not so much, as long as the second transistor can be driven. Accordingly, the source of the first transistor $Tr_1$ is considered to sufficiently rise to drive the second transistor $Tr_2$.

In the case that the second transistor $Tr_2$ is designed only to have a switching speed of 70 microseconds, there are formed a number of such transistors with in an actual panel and some transistors among them may have switching speeds as high as 60 microseconds. Such disparity of switching speed originates from production variation such as differences in mobility due to slightly differences in quality of the active region, differences in channel length and channel width due to slight variation of photomasks. In this case, if the driving voltage is supplied to the voltage supplying line just after the addressing signal, some transistor $Tr_2$ having 70 microsecond switching speed is turned on 10 microsecond after other transistor $Tr_2$ on the same panel having 60 microsecond switching speed is turned on. The difference of 10 microseconds is equal to 2% of the periodic cycle of the addressing signal.

The problematic 2% dispersion makes the 64 grades meaningless because the time dispersion of voltage application to the pixels must be limited to 1.6% in order to actually realize 64 grades. Of course, the problematic dispersion can be suppressed by sifting out productions resulting in a high cost to make even the switching speeds. The production cost, however, is significantly increased.

On the other hand, if the driving voltage is supplied to the voltage supplying line when a certain time (80 or 100 microseconds) elapses after the addressing pulse disappears, all the pixels are given the driving voltage substantially at the same time point in each cycle. In this case, the problematic dispersion is dictated only by factors such as the on resistance of the transistor $Tr_2$ and the capacitance associated with the electrode pad. The on resistance and the capacitance are of the order of $10^{16}$ ohm and the order of $10^{-13}$F so that the time constant is about 100 nanoseconds.

Accordingly, even if the time constant is dispersed from pixel to pixel, the problematic dispersion is no larger than 100 nanoseconds unless the dispersion of the time constant does not exceed 50%, 100 nanoseconds is extremely small as compared with the periodic cycle of 500 microseconds (0.02%) and meets the requirement of within 1.6%. Accordingly, it is effective for finely grading to supply the driving voltage a certain time after the addressing signal disappears.

Similar attention has to be paid when the driving voltage is removed. Namely, a certain time period defining a space duration is provided between the removal of the driving voltage and the application of the addressing signal in order to discharge electric charge accumulated in the electrode pad of the pixel. If the driving voltage is supplied to the electrode pad when the addressing voltage is supplied to the gate of the first transistor $Tr_1$, the electric charge remains at the electrode pad in the case that the data signal on the data line $V_D$ is 0 and turns off the second transistor $Tr_2$. In order to avoid such a case, electric charge accumulated at the electrode pad is discharged for the certain time period τ interposed between the driving voltage signal and the addressing signal. The certain time period τ corresponds to the time constant as discussed above.

In the next cycle, the driving voltage is inverted. The negative driving voltage is supplied to the drain of the second transistor $Tr_2$ also the certain time period after the addressing signal. The data signal need not be inverted unlike in conventional displays.

As seen from FIG. 2(C), voltage drops are observed only in the gate voltage of the second transistor $Tr_2$. The driving voltage applied to the electrode pad of the pixel exhibits no such variation and no reduction due to natural discharge. This is because the driving voltage is continuously given from the voltage supplying line in accordance with the present invention whereas the voltage at the pixel is supported by electric charge locked by a transistor being turned off in conventional cases. The present invention just features this difference.

Furthermore, broken line is plotted in the figure for the purpose of showing possible poor characteristics of a first transistor $Tr_1$. Namely, because of the poor characteristics, the source voltage can not reach to the drain voltage and is largely influenced by voltage drop when the addressing voltage disappears, followed by a relatively large natural discharge. In accordance with a conventional display having such a transistor, displayed images comprise irregular colors so that the display is not accepted. As seen from the figure, however, the voltage driven by such a transistor can operate with no trouble. Namely, even if the transistor $Tr_1$ exhibits such poor characteristics as shown by broken line, there arise no problem as long as the source voltage can drive the second transistor $Tr_2$.

As seen from the figure, even if the source voltage $V_1$ is lowered as plotted with broken line, no influence appears on the driving voltage at the electrode pad of the pixel. The voltage at the data line is preferably selected in order to guarantee that a most poor one of the first transistors can drive the corresponding second transistor. Of course, the voltage must not be selected to destroy the transistor.

In accordance with experiments conducted by the applicants using small scale liquid crystal panels with 100 pixels (10 rows×10 columns), it was very easy to form nine for each ten transistors, functioning as the first transistor $Tr_1$, capable of providing 5 V or higher voltage at its source during operation of the panel in the case that the addressing voltage and the voltage at the data line corresponding to 1 are 15 V and 10 V respectively. The yield was no lower than 95%. In this case, when the voltages applied to the gate and the drain of the first transistor were furthermore increased by 5 V respectively, the yield of the transistors providing 5 V or higher was 99% without no destructed sample.

Experiments were conducted for reference by constructing a conventional type liquid crystal display with transistors having such poor characteristics. As a result, only 60% of transistors could provide voltages at corresponding electrode pads within a range of ±0.9 V from the average voltage of 7.2 V. This means that 40% of the transistors were inappropriate even for realizing only 8 grades. When panels were selected in order that at least 90% of transistors met the requirement of 7.2±0.9 V, the yield was significantly decreased. Of course, such experiments were not conducted at best conditions so that it may be possible to improve the result to some extent. The production of more large panel liquid crystal displays, however, is considered to be very difficult.

From the conventional view point, such a configuration having two transistors for one pixel might seem to have adverse affects for increasing the yield. The requirement upon the characteristics of the transistors, however, is significantly low so that the yield is not reduced by the configuration.

The present invention is therefore based upon the concept that if a certain pixel is selected to be active, a constant voltage should be always applied to that pixel. Accordingly, it is avoided that the voltage level at the pixel gradually decreases due to discharge. In accordance with the present invention, the yield is significantly improved as compared with those of conventional analog or digital systems. The displays in accordance with the present invention can maintain a sufficient grading ability even with TFTs having poor characteristics, and as a result the yield and cost performance are significantly improved. It is also advantageous to manufacture displays having qualities no lower than those of conventional displays only with a lower manufacturing cost.

If TFTs are formed by self-alignment processes in the manufacturing method of the present invention, the liquid crystal displays as manufactured become furthermore excellent in operation at high frequencies and in realizing finely graded images. Even if polysilicon TFTs are formed by non-self-alignment processes in the manufacturing method of the present invention, it is possible to display clear images in 64 or more grades without particular difficulties at a cost which is no higher than or significantly lower than that of conventional analog systems capable of 16 graded images. Also even if amorphous silicon TFTs are formed by non-self-alignment processes in the manufacturing method of the present invention, it is possible to display clear images in 15 or more grades at a low cost.

BRIEF DESCRIPTION OF THE DRAWINGS

The accompanying drawings, which are incorporated in an form a part of the invention and, together with the description, serve to explain the principles of the invention.

FIG. 8 is a schematic diagram showing a grading operation of an electro-optical liquid crystal display in accordance with the present invention.

DETAILED DESCRIPTION OF THE PREFERRED EMBODIMENTS

Figure 1A:
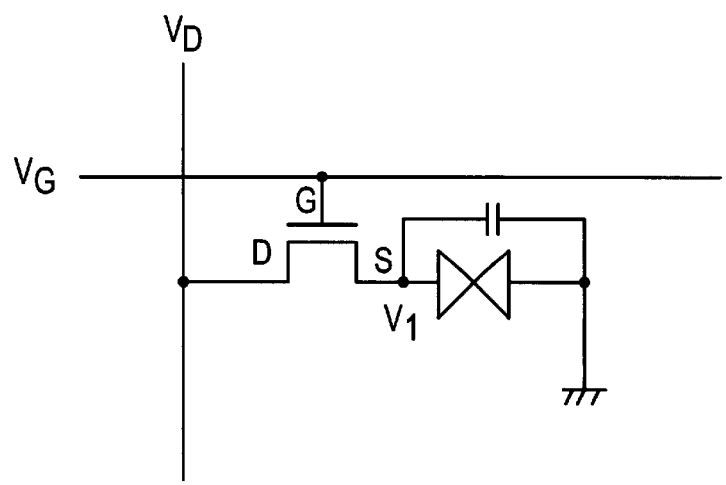
FIGS. 1(A) and 1(B) are a schematic circuit diagram and a graphical diagram showing a prior art electro-optical liquid crystal display.
Figure 1B:
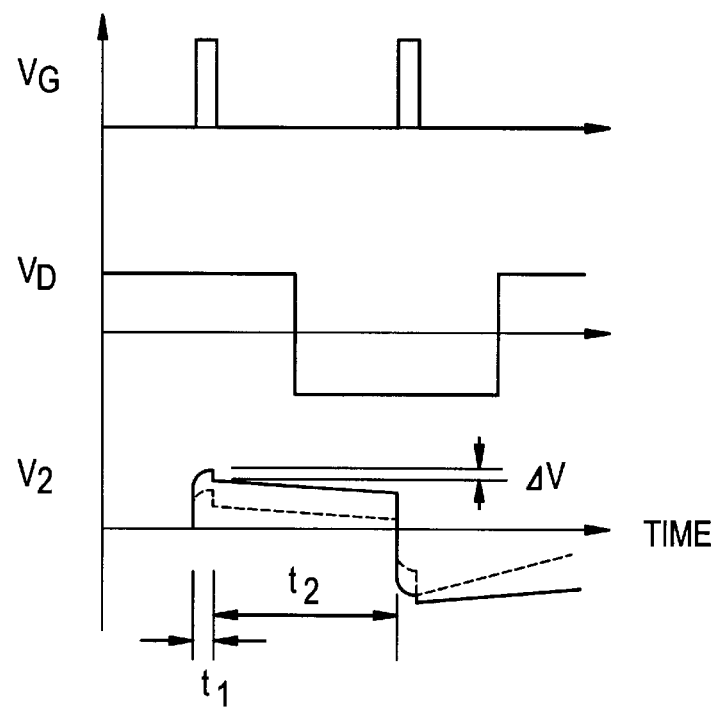
Figure 2A:
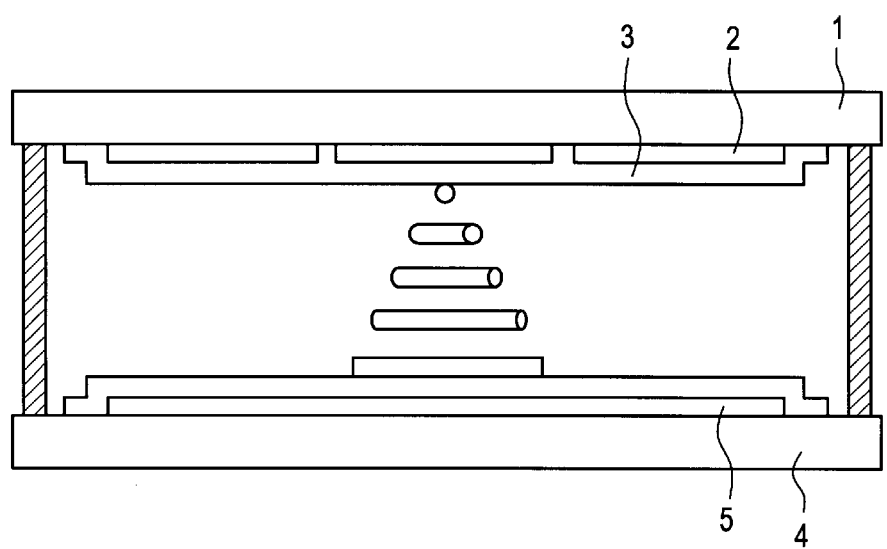
FIG. 2(A) is a cross sectional view showing a general configuration of an electro-optical liquid crystal display in accordance with the present invention.

A twisted nematic liquid crystal device in accordance with the present invention is schematically illustrated in FIG. 2(A), a glass substrate 1 is provided with an electrode arrangement 2 made of indium tin oxide. The electrode arrangement 2 comprises a number of electrode pads arranged in a matrix and defining pixels of the display. The inner surface of the substrate 1 is coated with polyimide film 3 over the first electrode arrangement Z. An orientation control surface is formed by rubbing the polyimide film 3. Another glass substrate 4 is prepared in the same manner but with an opposed electrode 5 which is common to the respective pixels. These substrates 1 and 4 are joined in order that the rubbing directions are perpendicular to each other. When a twisted nematic liquid crystal material is disposed between the first and second substrates, the liquid crystal molecules are aligned parallel to the rubbing directions at the both surfaces of the substrates so that a helix is formed between the substrates with a minimal energy condition of the liquid crystal molecules to modulate an incident light passing through the liquid crystal layer. If the electrode pads 2 of selected pixels are supplied with a driving voltage, an electric field is formed between the opposed electrode and each electrode pad so that the molecules of the liquid crystal are aligned normal to the substrates to pass an incident light without modulation.

The present invention relates particularly to a technique to the circuit for supplying the driving voltage to each pixel. The details of the circuit will be described hereinafter in details.

Figure 2B:
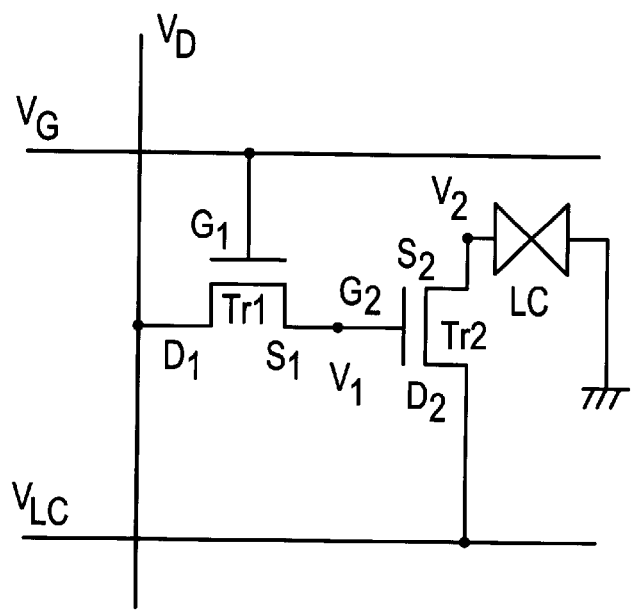
FIGS. 2(B) and 2(C) are a schematic circuit diagram and a graphical diagram showing an electro-optical liquid crystal display and its operation in accordance with a first embodiment of the present invention.
Figure 2C:
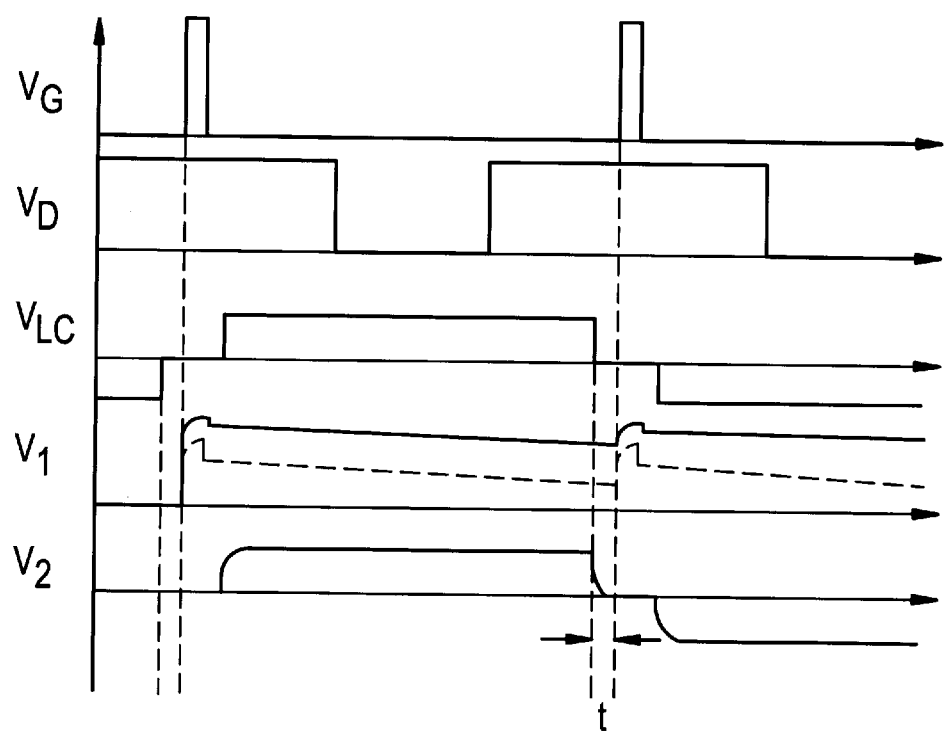

Referring now to FIGS. 2(B) and 2(C), a liquid crystal display in accordance with a first embodiment of the present invention will be explained. FIG. 2(B) is a schematic circuit diagram showing one pixel of the liquid crystal display. FIG. 2(C) is a graphical diagram showing voltage levels appearing at respective nodes of the circuit diagram during operation. The display comprises a number of such pixels arranged in a matrix. A particular column can be made active by activating a corresponding one of the data lines $V_D$ whereas a particular row can be made active by suitably activating the corresponding addressing line $V_G$ and the corresponding voltage supplying line $V_{LC}$.

The circuit for driving one pixel as shown in FIG. 2(B) comprises a first n type thin film transistor $Tr_1$ and a second n type thin film transistor $Tr_2$. The first transistor $Tr_1$ is connected with the data line $V_D$ at its drain, the addressing line $V_G$ at its gate and the gate of the second transistor $Tr_2$ at its source in order to transfer a level at the data line $V_D$ to the gate of the second transistor $Tr_2$ when addressed by the addressing line $V_G$. The source and the drain of the second transistor $Tr_2$ are connected to the electrode pad of a liquid crystal LC and the voltage supplying line $V_{LC}$. The electrode pad is formed to define one pixel in the liquid crystal.

The circuit operates as follows. When addressed (given a positive gate signal from the addressing line $V_G$), the first transistor $Tr_1$ is turned on to transfer the data level at the data line $V_D$ to the gate of the second transistor $Tr_2$. If the data level is "1", the second transistor $Tr_2$ is turned on to supply the pixel with a voltage at the voltage supplying line $V_{LC}$ in order to activate the pixel. On the other hand, if the data level is "0", the second transistor $Tr_2$ is turned off. The voltage at the gate of the second transistor $Tr_2$ is maintained when the addressing voltage is removed from the addressing line $V_G$ to address a next row.

FIG. 2(C) illustrates signal levels at respective nodes and the relationship among these signals. As shown in the figure, the voltage supplying line $V_{LC}$ is alternatively set at a positive level ad a negative level. Each signal is maintained for most of one frame except for a certain time period around the pulse appearing at the addressing line $V_G$. The pixel is reset at 0 during the certain time period with $V_{LC}=0$ when the pixel is addressed by the addressing line $V_G$. In this regard, therefore, it is noted that the activated pixel is supplied with the positive or negative voltage from the voltage supplying line $V_{LC}$ for most of the frame length so that, even if current leakage occurs, the voltage shall not be decreased as long as the transistor $Tr_2$ is turned on during frames. FIG. 2(C) is detailedly explained also in SUMMARY OF THE INVENTION.

In the configuration illustrated in FIG. 2(B), two signals line $V_G$ and $V_{LC}$ have to be formed for one row and therefore such a configuration seems to decrease the aperture ratio of pixels. In the configuration of conventional displays utilizing amorphous silicon TFTs, the similar problem is also the case since an additional line is formed in parallel to an addressing line in order to form a supplemental capacitance to cope with a parasitic capacitance associated with the TFT.

Figure 3A:
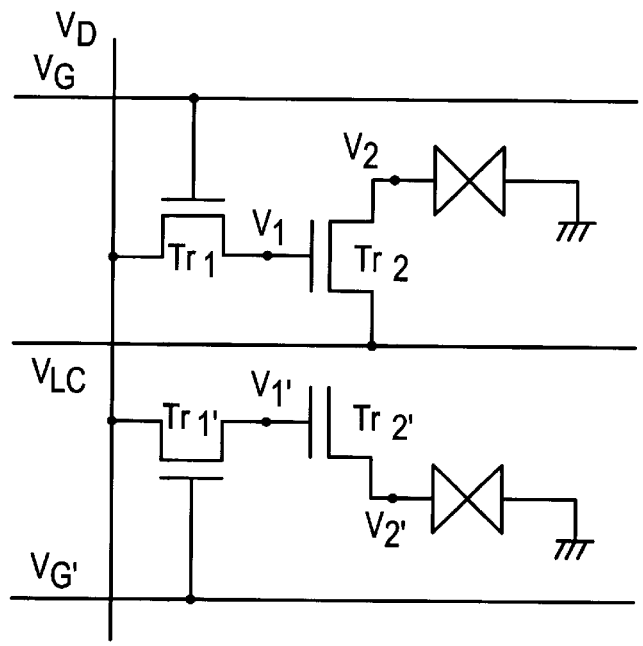
FIGS. 3(A) and 3(B) are a schematic circuit diagram and a graphical diagram showing an electro-optical liquid crystal display and its operation in accordance with a second embodiment of the present invention.

This problem is solved by employing the circuit shown in FIG. 3(A) illustrating a second embodiment of the present invention. In this circuit, each pair of adjacent pixels in a same column are formed to share a same voltage supplying line $V_{LC}$. Other elements are constructed in the same manner as those of the first embodiment. By employing such a configuration, the density of horizontal lines is reduced by 25%. In the same manner, three or more pixels on a same column can share a common voltage supplying line by modifying the circuit design.

In this case, since one voltage supplying line supplies a driving voltage for two rows, the driving voltage has to be grounded, when the two rows are addressed, in order to discharge electric charge accumulated in these pixels. Namely, there is a space duration at the voltage supplying line $V_{LC}$ corresponding to the addressing pulses to the addressing lines $V_G$ and $V_G'$.

Figure 3B:
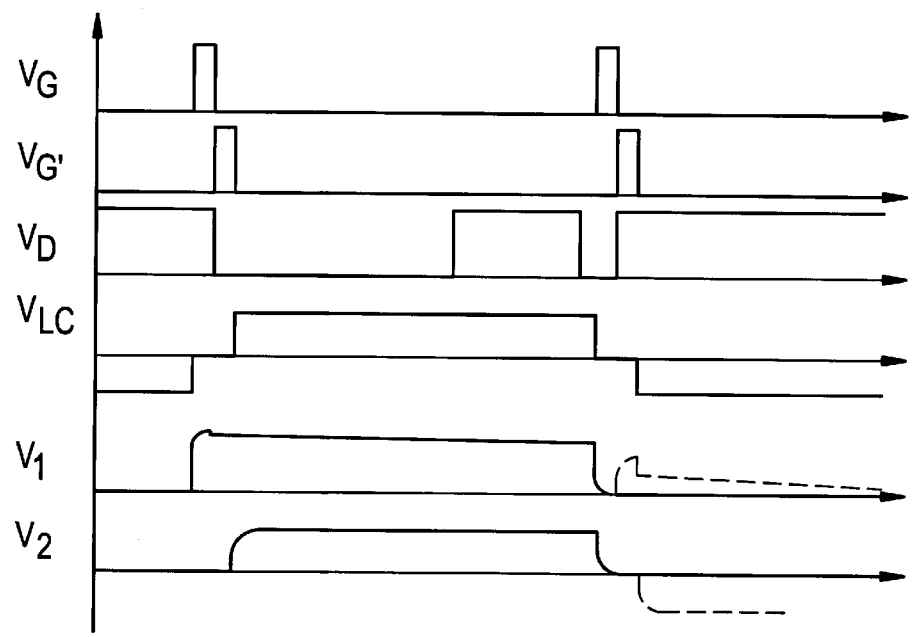

In FIG. 3(B), an addressing signal is given to the addressing line $V_G$ with the data line $V_D$ being 1 so that the first and second transistors $Tr_1$ and $Tr_2$ are turned on. Next, the addressing signal is removed from the addressing line $V_G$ and, instead, given to the next addressing line $V_G'$, so that the first transistor $Tr_1$ is turned off and the next first transistor $Tr_1'$ is turned on. The second transistor $Tr_2$ is then maintained turned on for the frame in order to transmit the voltage level from the voltage supplying line to the pixel. Although the first transistor $Tr_1'$ is turned on, the corresponding second transistor $Tr_2'$ is not turned on because the data line is set at 0 in this time and therefore maintained turned off for the frame after the first transistor $Tr1'$ is turned off so that the voltage level $V_2$, at the lower pixel is maintained at 0.

In the next frame, the data line is set at 1 when the addressing line $V_G$, is addressed so that the first transistor $Tr_1$, is turned on and transmit 1 to the gate of the second transistor $Tr_2'$. If the characteristics of the transistor $Tr_1$, are not good, the gate of the second transistor $Tr_2$, may be elevated only to a low voltage level as illustrated with broken line in the figure. The second transistor $Tr2'$, however, can be turned on, as long as the voltage level $V_1$, reaches to the threshold voltage of the second transistor, and therefore the voltage level $V_2$, can be elevated to the level of the voltage supplying line as illustrated with broken line.

Figure 4A:
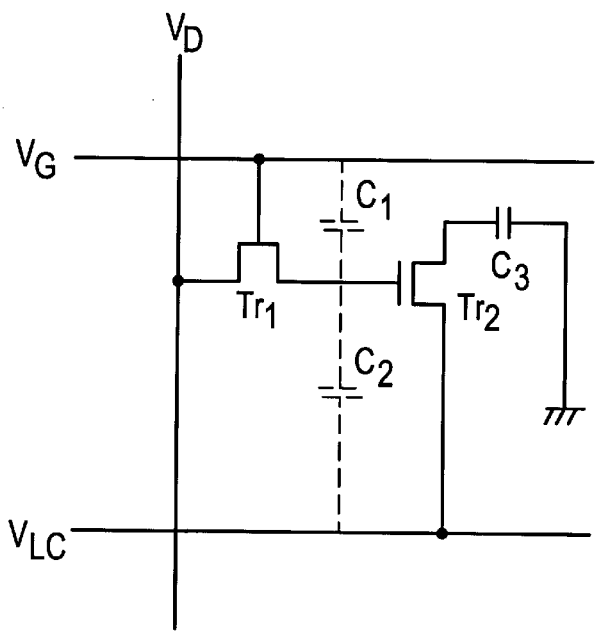
FIGS. 4(A) to 4(C) are a schematic circuit diagram and graphical diagrams for explaining in details the operation of the electro-optical liquid crystal display in accordance with the first embodiment of the present invention.
Figure 4B:
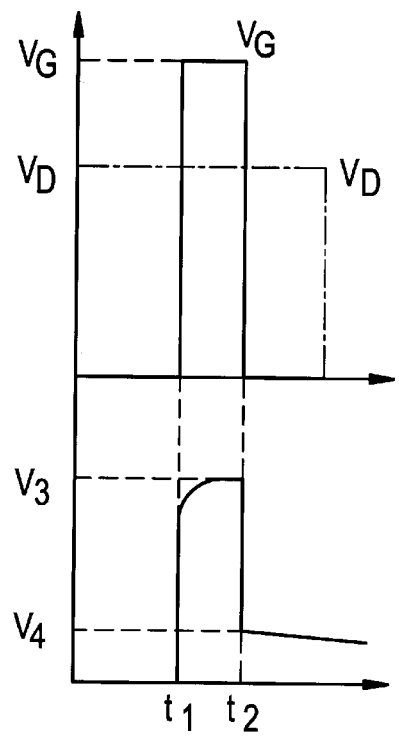
Figure 4C:
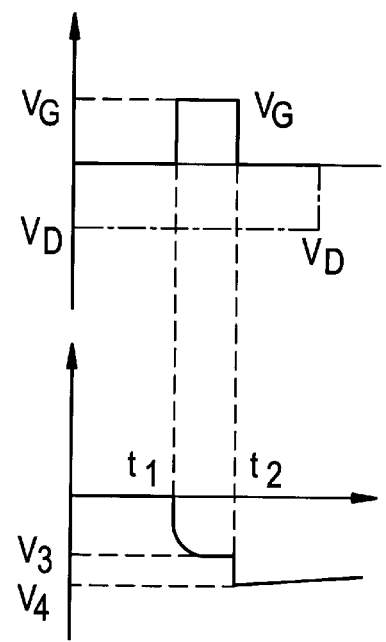

The operations of the first transistor and the second transistor will be analyzed below with reference to FIGS. 4(A) to 4(C). The parasitic capacitance $C_1$ between the source and the gate of the transistor $Tr_1$ and the parasitic capacitance $C_2$ between the drain and the gate of the transistor $Tr_2$ are illustrated in FIG. 4(A) with broken line. Because of the capacitance $C_1$, the voltage drop at the source of the first transistor $Tr_1$ is caused as explained before. The voltage drop $\Delta V$ is calculated by the following equation.

$$\Delta V = C_1 V_G / (C_1 + C_2)$$

The capacitance $C_2$ is dictated by the area of the gate electrode and the thickness and the dielectric constant of the gate insulating film of the second transistor $Tr_2$. In accordance with the present invention, the configuration of the transistor $Tr_2$ is designed in order that the capacitance $C_2$ is relatively small, e.g. no larger than 1% of the capacitance associated with the pixel. With this configuration, the display can be driven 100 times as faster as conventional displays.

In this case, however, the capacitance $C_1$ an sometimes not be neglected as compared with the capacitance $C_2$. For example, the capacitance $C_1$ may be equal to the capacitance $C_2$. In a conventional display, the transistor addressed by the addressing line has a capacitance which is always smaller than that of the pixel at least by one order of magnitude, so that the voltage drop is not so large. If the capacitance $C_1$ equals the capacitance $C_2$, the voltage drop is half the voltage applied to the gate of the first transistor $Tr_1$. FIG. 4(B) illustrates the variation of the source level in response to the pulse application to the gate of the first transistor $Tr_1$. The addressing signal is assumed to be 30V. The data signal is assumed to be 20V. The source level of the transistor $Tr_1$ then rises to 20 V ($V_3$) in response to the pulse of 30V at the gate. The source level, however, drops down to 5V ($V_4$) after the gate voltage is removed because of a voltage drop equivalent to half the gate voltage, 30V. Such situation is not fatal to the display in accordance with the present invention as long as 5V is sufficient to turn on the second transistor $Tr_2$. Namely, irrespective of the variation of the source levels of the first transistors in the pixels of a panel, the second transistors can be equally turned on, unlike conventional displays whose quality reflects the disparity of the characteristics of the transistors. Furthermore, even if the data signal of the present invention is increased to a high voltage level to cope with the worst transistor, the high voltage is not directly applied to the liquid crystal so that the liquid crystal is not damaged by the high voltage. Namely, in this case, the high voltage is applied to the gate electrode of the second transistor $Tr_2$ which has a withstanding voltage from several times to ten and several times as high as that of the liquid crystal.

On the other hand, the high voltage such as 30V is not desirable from the view point of power consumption and damage to other circuitry or a human body. This problem can be solved by inverting the driving voltage supplied from the voltage supplying line as will be explained with FIG. 4(C). Namely, if the data signal supplied from the data line $V_D$ is negative, the absolute value of the voltage at the source is increased by the voltage drop as illustrated in FIG. 4(C). When the driving voltage and the data signal are +5V and −5V, the final voltage of the source of the first transistor becomes −7.5V. In this case, data may be supplied from the data line in terms of binary states corresponding to the source level of the first transistor. The second transistor therefore has to be selectively turned on or off in response to the negative voltage and the ground. For example, the second transistor may be a p-channel enhancement mode transistor or an n-channel depression mode transistor. Anyway, it is an advantage that both the addressing line and the data line can be driven by a single voltage source of 5V.

When the addressing line is addressed with the data line being 0, the source of the first transistor $T_1$ is pushed down to −2.5V due to the voltage drop. In this case, the p-type second transistor may be turned on in error and transmit the driving voltage to the pixel, if it is a polysilicon transistor having a threshold voltage higher than −2.5V. Such a trouble can be avoided by supplying a positive voltage such as +2.5V to the data line to guarantee that the second transistor is turned off with its gate being at 0V. The data is supplied in this case to the data line in terms of binary signals consisting of +2.5V and −5V.

Figure 5A:
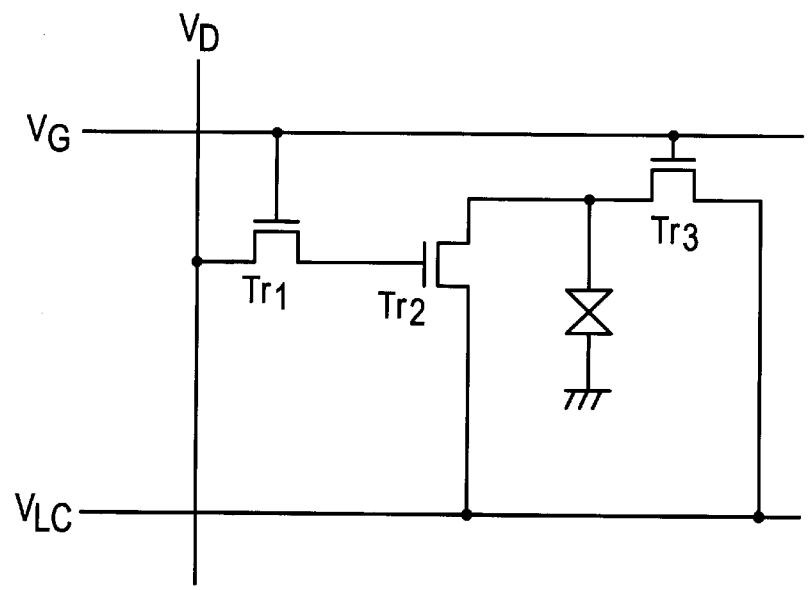
FIG. 5(A) is a schematic circuit diagram showing an electro-optical liquid crystal display in accordance with a third embodiment of the present invention.
Figure 5B:
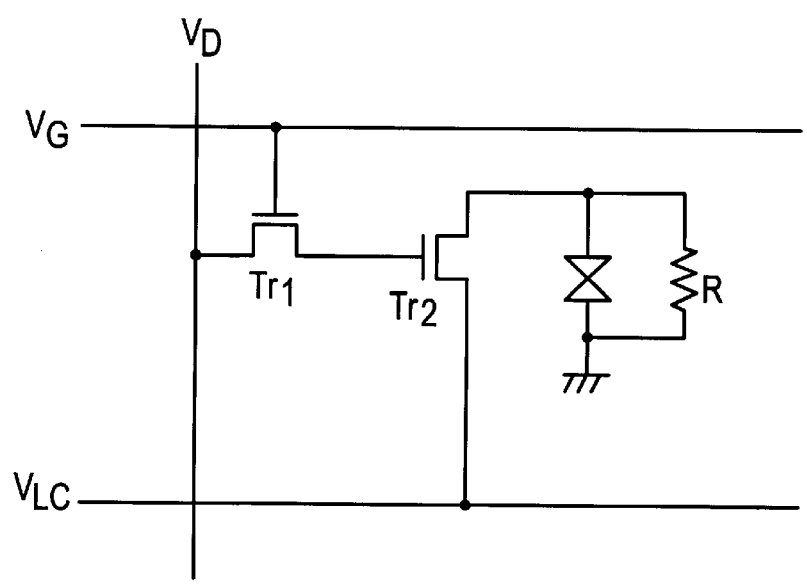
FIG. 5(B) is a schematic circuit diagram showing an electro-optical liquid crystal display in accordance with a modification of the third embodiment of the present invention.

In the preceding embodiments, electric charge is eliminated from each pixel by grounding the voltage supplying line just before the corresponding first transistor is turned on. The electric charge can be more positively eliminated as in a third embodiment of the present invention illustrated in FIG. 5(A). In this case, a third transistor $Tr_3$ is connected between the addressing line and the voltage supplying line. Since the gate of the third transistor $Tr_3$ is connected to the data line, electric charge is eliminated during application of an addressing signal to the transistor $Tr_3$. The parasitic capacitance between the gate and the drain of the third transistor $T_3$ causes a voltage drop. The voltage drop is neglected because the capacitance associated with the electrode pad of the pixel is substantially greater than the parasitic capacitance. Alternatively, a resistance may be inserted in parallel to the liquid crystal as illustrated in FIG. 5(B). Each pixel comprises a capacitor comprising the electrode pad, the electro-optical modulating layer (liquid crystal layer) and the opposed electrode arrangement. A resistor may be provided in parallel with the capacitor for each pixel. The time constant of the resistance of the liquid crystal is preferably selected to be on the same order as the time period of one frame, e.g. 33 milliseconds in usual mode displays. If more high speed discharge is desired as in digital grading, the time constant is selected to be as short as 500 microseconds for 64 grades or 125 microseconds for 256 grades in order to obtain clear images without afterimages and blurs.

It is impossible in conventional displays to provide such a bypass resistance through which electric charge escapes. Since dispersion of such resistances is usually about 20% or higher, the voltages across the liquid crystal at respective pixels are dispersed during one frame also in a 20% span. In accordance with the present invention, however, the voltage across the liquid crystal is supplied from the voltage supplying line and therefore the supplied voltages are maintained for each frame.

Figure 6A:
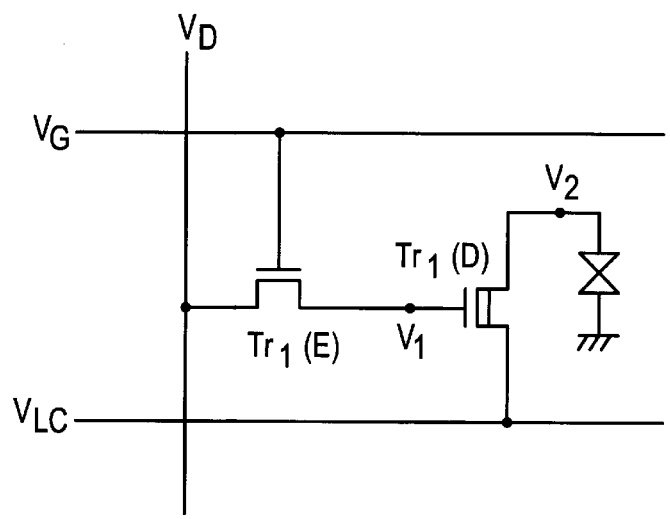
FIGS. 6(A) and 6(B) are a schematic circuit diagram and a graphical diagram showing an electro-optical liquid crystal display and its operation in accordance with a fourth embodiment of the present invention.

FIG. 6(A) illustrates one pixels of a liquid crystal display in accordance with a fourth embodiment of the present invention. The pixel is provided with an enhancement type NMOS transistor as the first transistor $Tr_1$ and a depression type NMOS transistor as the second transistor $T_2$. The pixel is driven in the following manner as explained with reference to FIG. 8(B). The pixel is addressed by a pulse of 10V supplied from the addressing line. Data is given to the data line in terms of binary signals of +8V and −8V. When a 10V pulse is applied to the addressing line with the data line being set at +8V, the first transistor is turned on and thereafter turned off to generate the source voltage $V_1$ which rises and then drops as illustrated and explained before. In this case, the source voltage $V_1$ rises to +8V and drops to 3V due to a voltage drop of 5V. The transistor $Tr_2$ is turned on by the voltage $V_1$ and transmits the driving voltage from the voltage supplying line to the pixel, since it operates in a depression mode. If the data signal at the data line is −5V in the next frame as illustrated, the source voltage $V_1$ is eventually set at −13V due to a voltage drop of 5V. The second transistor is turned off in response to the voltage change at the source and isolates the pixel from the voltage supplying line. Of course, if the data line remains at +8V also in the next frame as depicted with broken line in the figure, the second transistor remains turned on to transmit the negative voltage at the voltage supplying line to the pixel.

Figure 7A:
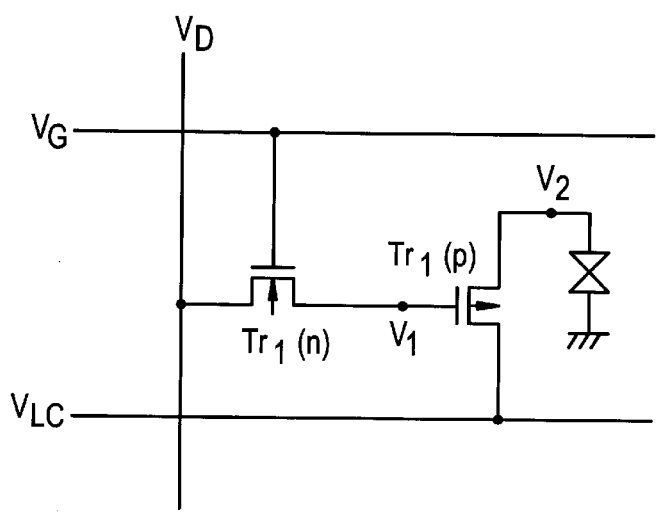
FIGS. 7(A) and 7(B) are a schematic circuit diagram and a graphical diagram showing an electro-optical liquid crystal display and its operation in accordance with a fifth embodiment of the present invention.
Figure 7B:
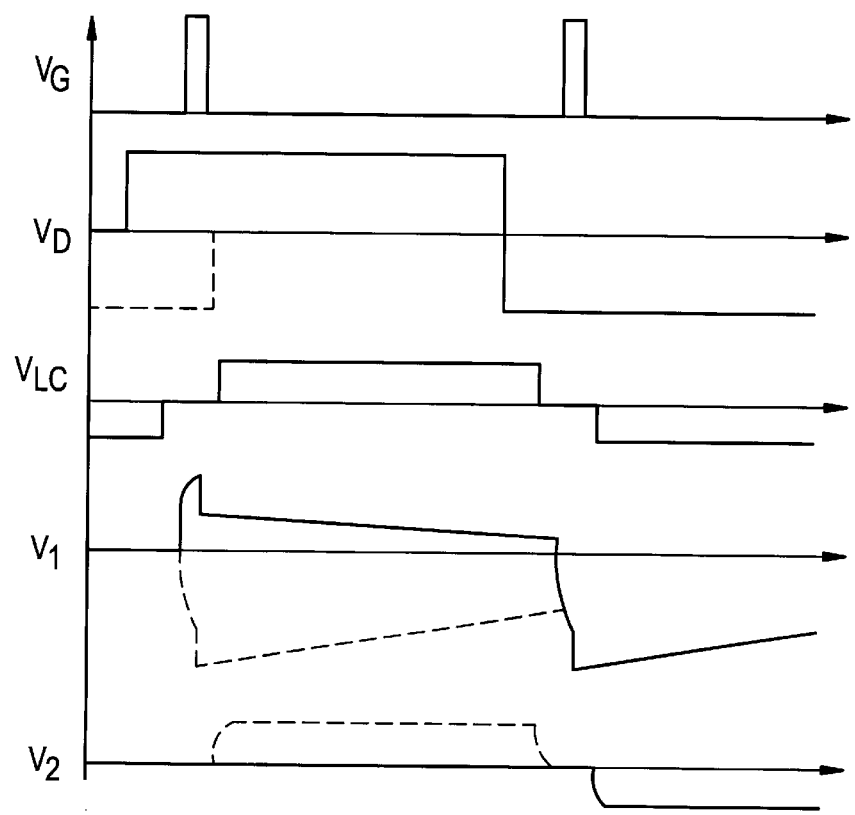

FIG. 7(A) illustrates one pixel of a liquid crystal display in accordance with a fifth embodiment of the present invention. The pixel is provided with CMOS transistors comprising an n-type transistor as the first transistor $Tr_1$ and a p-type transistor as the second transistor $Tr_2$. The pixel is driven in the following manner as explained with reference to FIG. 7(B). The pixel is addressed by a pulse of 10V supplied from the addressing line. Data is given to the data line in terms of binary signals of +8V and −8V. In this case, however, an negative voltage (−8V) is given to the data line in order to activate the pixel in the opposite manner as compared to the previous embodiment. When a 10V pulse is applied to the addressing line with the data line being set at +8V, the first transistor $Tr_1$ is turned on and thereafter turned off to generate the source voltage $V_1$ which rises and then drops as illustrated and explained before. In this case, the source voltage $V_1$ rises to +8V and drops to 3V due to a voltage drop of 5V. The transistor $Tr_2$ is turned off by the voltage $V_1$ and isolates the pixel from the voltage supplying line so that the pixel remains grounded. If the data signal at the data line is −8V, after discharge of the pixel with the voltage supplying line being grounded, in the next frame as illustrated, the source voltage $V_1$ is eventually set at −13V due to a voltage drop of 5V. The second transistor is turned on in response to the voltage change at the gate and transmits the negative driving voltage from the voltage supplying line to the pixel. Of course, if the pixel is desired to be activated for the two frames as depicted with broken line in the figure, the second transistor remains turned on through the two frames to transmit the positive voltage and the negative voltage from the voltage supplying line to the pixel.

Next, examples of signals supplied to the respective lines of the liquid crystal display in accordance with the fifth embodiment of the present invention to construct images in 32 grades will be explained with reference to FIG. 8. Of course, a greater number of grades than 32 can be realized in the same manner. Details of this technique is described in Japanese Patent application No.Hei3-209859 filed by the same applicant.

Figure 6B:
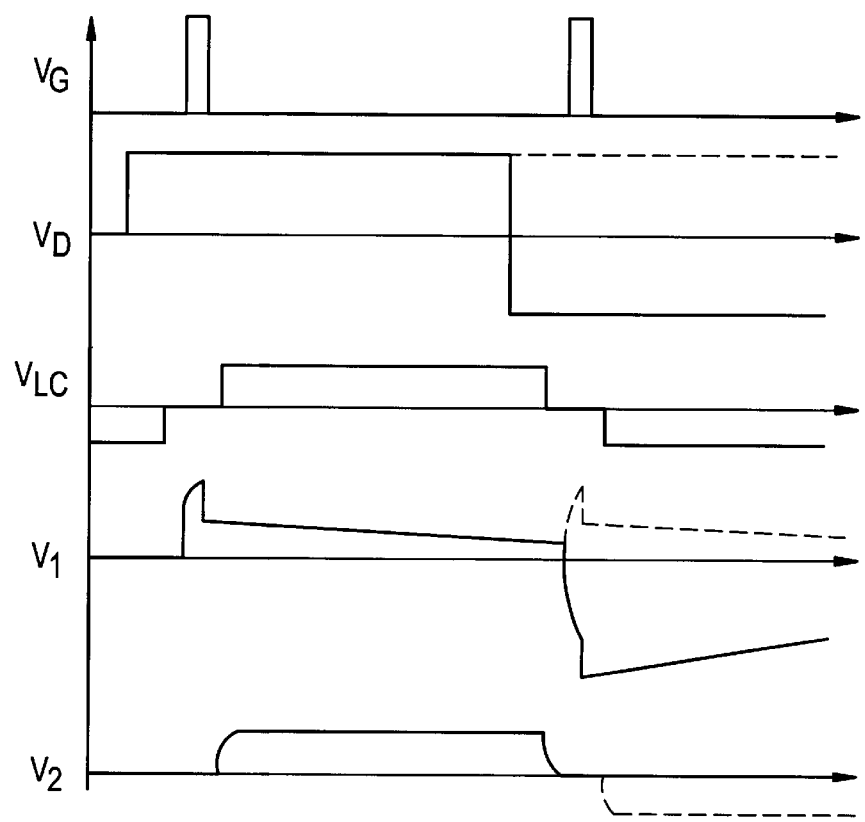

It takes 33 microseconds to construct an image of one frame. FIG. 6 illustrates signals appearing within one frame which is divided into five periods. The shortest period lasts for a unit time To as shown in the right of the figure. The driving voltage is applied to the supplying line, e.g. for only 70% to 90% of the period for the above explained reason. Although the other four periods are illustrated to have the same width as the shortest period in the figure for convenience, these periods last respectively for 16 To, 2 To, 8 To and 4 To in fact. All the rows of the display are scanned one time within each period in the same manner. For example, when an addressing signal having 1 microsecond pulse width is supplied to the addressing line $V_G$ of the row connected to the pixel with the corresponding data line $V_D$ being at +8V, the second transistor $Tr_2$ is turned off and the off-condition is maintained throughout the shortest period. When an addressing signal is supplied again to the addressing line $V_G$ at the start of the next 16 To period with the corresponding data line $V_D$ being at +8 V, the off-condition of the second transistor is furthermore maintained throughout the 16 To period. The voltage across the liquid crystal is 0 during these periods. When an addressing signal is supplied again to the addressing line $V_G$ at the start of the next 2 To period with the corresponding data line $V_D$ being at −8 V, the second transistor $Tr_g$ is turned on and the on-condition is maintained throughout the period. When an addressing signal is supplied again to the addressing line $V_G$ at the start of the next 8 To period with the corresponding data line $V_D$ being at −8 V, the on-condition of the second transistor is furthermore maintained throughout the 8 Tc period. The liquid crystal is supplied with the driving voltage during these periods. When an addressing signal is supplied again to the addressing line $V_G$ at the start of the next 4 To period with the corresponding data line $V_D$ being at +8 V, the second transistor $Tr_2$ is turned off and the off-condition of the second transistor is maintained throughout the 4 To period. In this case, the liquid crystal is activated for total time of 10 To out of 31 To. It will be understood that the total time can be arbitrarily changed by the unit time To from 0 to SiTo in order to obtain a desired grade by suitably combining the five periods.

The unit period To is selected to be about 32nd of one frame (33/32 milliseconds), i.e. about 1 millisecond. As explained in the previous embodiment, a space duration is provided between the addressing signal and the driving voltage. The space duration is selected to be 10 microseconds as shown in FIG. 8. The driving voltage lasts for 0.88 millisecond within the To period. Exactly saying, the space duration has to be selected is proportion to the length of each period in order to obtain these grades in the ratios of whole numbers. For example, the 18 To period is provided with a space duration of 160 microseconds to have the driving voltage lasting for 15.68 milliseconds, which is exactly 16 times 0.98 millisecond. The space duration, however, may be selected commonly to be 10 microseconds for all the periods since anyway the space duration is very short as compared with these periods. For example, if the 16 To period is provided with a space duration of 10 microseconds to have the driving voltage lasting for 15.98 milliseconds, the ratio is 1:16.12 which is not so largely different from 1:16.

The pulse width of the addressing signal is determined in accordance with the number of rows. If the number is 480, the pulse width is calculated by To/480, i.e. about 2 microseconds. In the figure, the pulse width is selected to be 1 microsecond for the purpose of avoiding interference between adjacent pulses. This requires high speed operations as compared with conventional cases of 30 to 70 microseconds pulse width. In accordance with the present invention, however, there arise no problem since the load of the transistor is significantly light as compared with that in the conventional cases. Experiments were conducted utilizing low quality transistors. The voltage drop was 25% of the gate voltage. The source voltage of the first transistor is reduced to 90% of the initial level after time To and to 50% after time 16 To. The display, however, normally operated as illustrated in FIG. 8.

Figure 9:
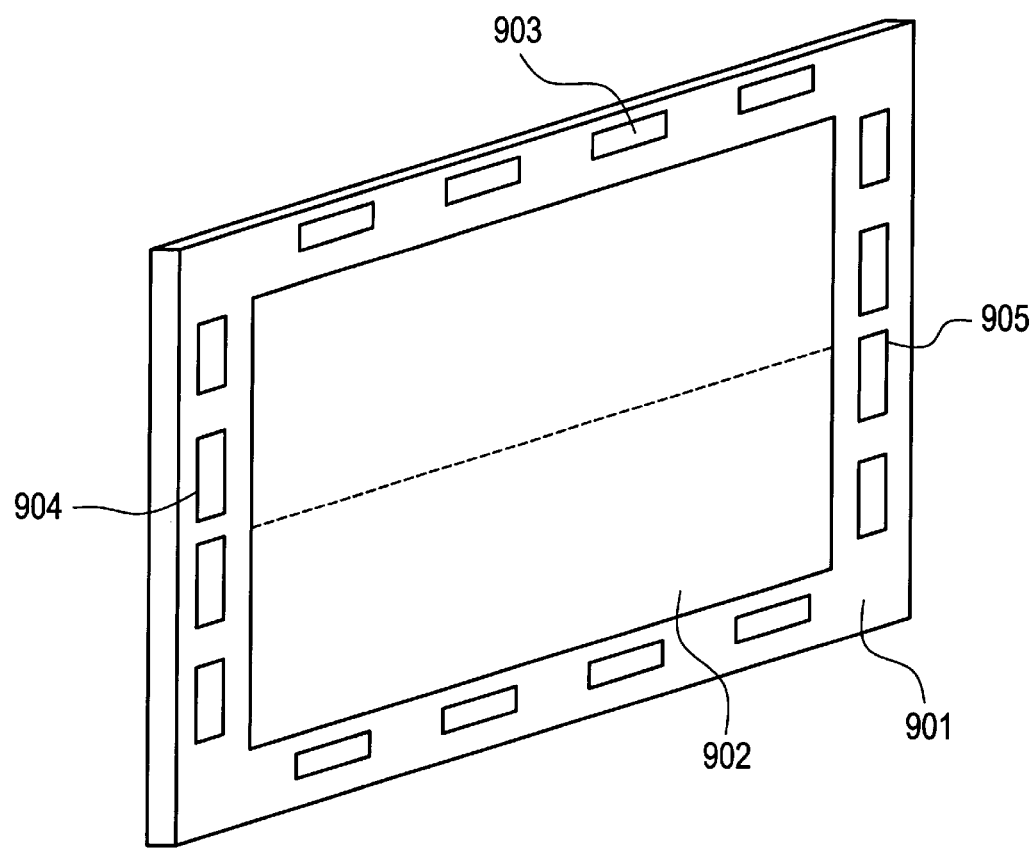
FIG. 9 is a perspective view showing the external appearance of an electro-optical liquid crystal display in accordance with the present invention.

The peripheral circuit for driving the liquid crystal panel in accordance with the present invention has to supply suitable in accordance with the present invention has to supply suitable signals to the voltage supplying lines in addition to the addressing lines and the data lines. If the panel is formed with polysilicon semiconductor thin film transistors in a self-alignment manner, the peripheral circuit can be formed at the same time in order that particular care need not be taken for coupling the circuit with the matrix of the panel. If the transistors are polysilicon transistors formed in a non-self-alignment manner or amorphous silicon transistors, the peripheral circuit must be separately formed in driver ICs and externally connected to the respective terminals of the panel. When the panel is designed to operate in a very high grading mode such as 256 grades, even self-aligned polysilicon thin film transistors can not be used and particular external driver ICs must be provided instead. In such a case, a liquid crystal panel 901 is provided with the terminals of the addressing line in the left side of the panel and the terminals of the voltage supplying lines in the right side of the panel as illustrated in FIG. 9. Driving ICs for supplying addressing signals and driving ICs for supplying driving voltages are mounted respectively in the left side of the panel and the right side of the panel. The panel is divided into two portions as defined by broken line in the figure. The two portions comprises an upper panel and a lower panel which can be driven independently by data signals supplied from ICs mounted on both the upper and lower sides of the panel. In this fashion, the upper and lower panels can be scanned in parallel so that the driving frequency can be reduced by half. This is particularly advantageous if a higher grading is desired.

Next, several methods of producing the circuit for supplying driving voltages to the pixel of the liquid crystal display in accordance with the present invention will be explained. These method can be suitably carried out, with some modification if necessary, in order to construct a variety of circuits including the above discussed embodiments, e.g. driving circuits comprising PMOS TFTs, NMOS TFTs, depression mode MOS TFTs, enhancement mode MOSTFTs, planar type transistors, stagger type transistors, or other type transistors having impurity regions formed in a self-alignment manner or a non-self-alignment manner. A first example is described with reference to FIGS. 10(A) to 10(D) showing cross sectional views of the circuit in respective steps and FIGS. 11(A) to 11(D) showing corresponding plan views. In the figure, numeral 107 designate the first transistor which has been discussed above in details while numeral 108 designate the second transistor.

A blocking film 102 is formed on a glass substrate 101. The blocking film 102 is made of silicon nitride, aluminum oxide or the like which can block movable ions such as sodium ions occurring in the substrate from entering silicon semiconductor films 104 of 20 to 100 nm thickness which are formed on the blocking film 102 through an insulating film 103. The insulating film 103 is formed from silicon oxide and functions to hinder formation of interfacial states which could otherwise occur between the blocking film 102 and the semiconductor film 104.

Figure 10A:
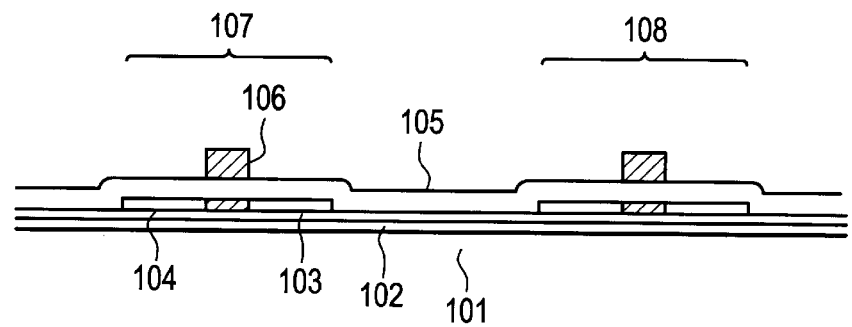
FIGS. 10(A) to 10(D) and FIGS. 11(A) to 11(D) are cross sectional views and plan views showing a method of manufacturing an electro-optical liquid crystal display in accordance with the present invention.
Figure 10B:
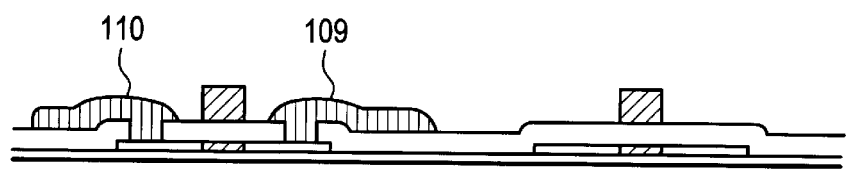
Figure 11A:
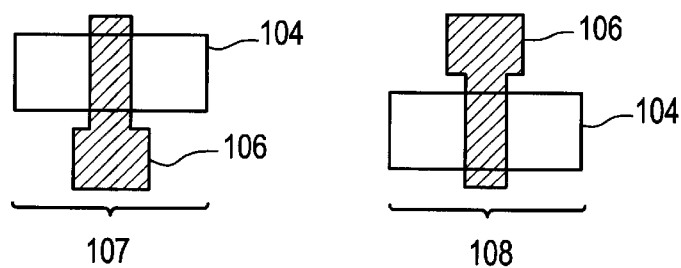

Each of the semiconductor films is formed with drain, source and channel regions therein. The left film becomes the active region of the first thin film transistor while the right film becomes the active region of the second thin film transistor. The conductivity types and the other characteristics of the respective semiconductor regions are determined in accordance with the whole circuit design which will be fully understood from the previous embodiments and therefore dispensed with here. The substrate 101 is then coated with an insulating film 105 of 50 to 200 nm thickness functioning as a gate insulating film over the semiconductor films 104. The gate insulating film is formed from silicon oxide, for example, by sputtering or ECR-CVD. Gate electrodes 106 are made, for example, of a highly doped polysilicon or a refractory metal such as Cr, W, which are particularly suitable when formed in a self-alignment manner, as illustrated in FIG. 10(A) and FIG. 11(A).

Figure 11B:
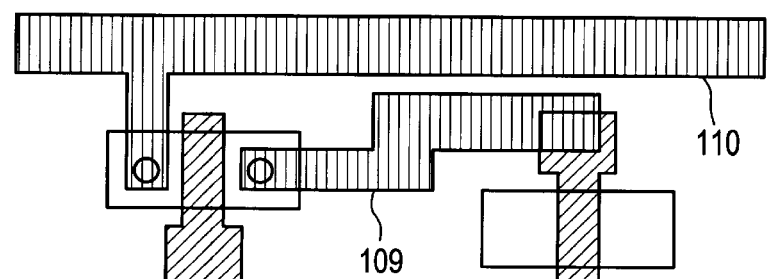

After suitable contact holes are opened through the insulating film 105 at the source 103 and the drain regions 104 of the first transistor 107, a wiring 109 and a data line 110 are formed from a metal by etching in order to make contact with the source region 103 and the drain region 104 respectively. The wiring 109 is formed also to make contact with the gate electrode 106 of the second transistor 108 in order to connect the source of the first transistor to the gate electrode of the second transistor as illustrated in FIG. 11(B).

Figure 10C:
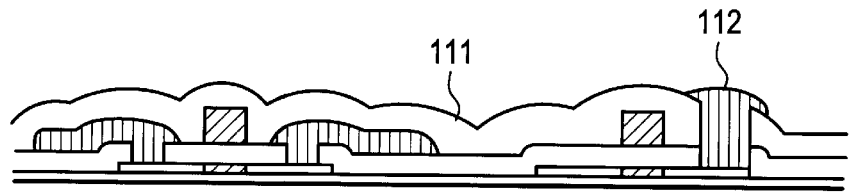
Figure 10D:
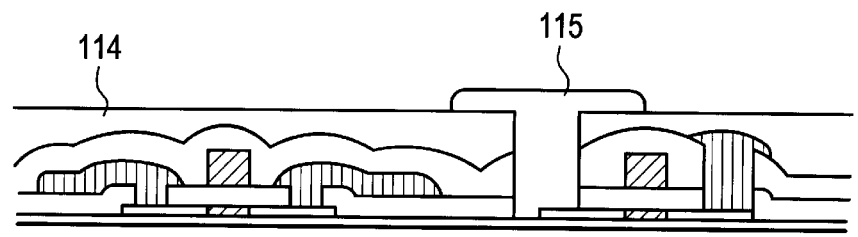
Figure 11C:
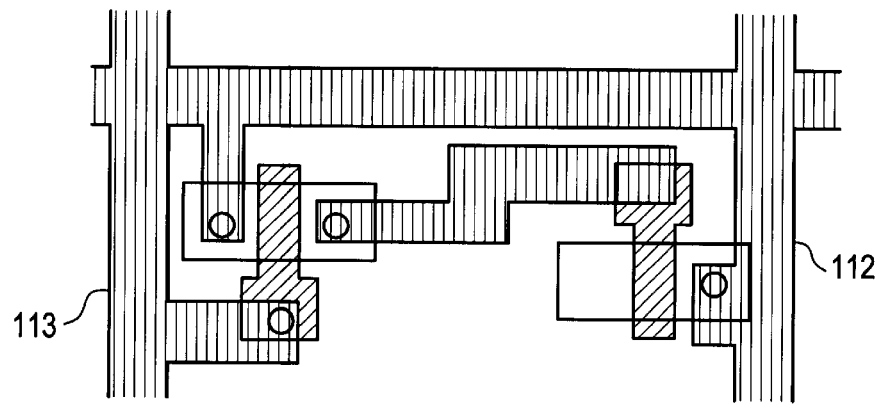
Figure 11D:
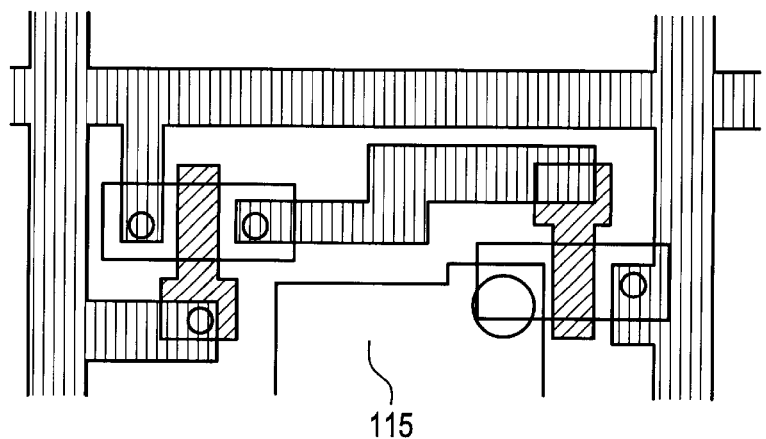

The structure is then coated with an interlayer insulating film 111. After suitable contact holes are opened through the interlayer insulating film 111 at the gate electrode of the first transistor 107 and the drain of the second transistor 108, an addressing line 112 and a voltage supplying line 112 are formed from a metal film by etching. The addressing line 113 and the voltage supplying line 112 are connected through the contact holes to the gate electrode of the first transistor 107 and the drain of the second transistor 108 respectively as illustrated in FIGS. 10(C) and 11(C). The interlayer insulating film 111 is particularly desired to be highly insulating because electric charge must be maintained at the gate of the second transistor during one frame.

The upper surface of the structure is then coated with a surface smoothing film 114. After a suitable contact hole is opened through the smoothing film 114 at the source of the second transistor 108, an electrode pad 115 of the pixel is formed from a transparent conductive film such as an ITO (an alloy of indium oxide and tin oxide) film to make contact with the source of the second transistor 108.

Referring next to FIGS. 12(A) to 12(D), a methods of producing the circuit for supplying driving voltages to the pixel of the liquid crystal display in accordance with the fourth embodiment of the present invention illustrated in FIG. 8(A) will be explained. In the figure numerals 109 and 210 designate the first and second transistors respectively in an inversed staggered type. FIGS. 12(A) to 12(D) are cross sectional views showing the circuit in respective steps.

A blocking film 202 is formed on a glass substrate 201 in the same manner as in the previous method. The blocking film 102 is made of silicon nitride for blocking movable ions such as sodium ions. Gate electrodes 203 are formed on the blocking film 102. The gate electrode of the first transistor 210 is formed integrally with the addressing line. These gate electrodes are preferably made of a metal such as aluminum or a semiconductor such as silicon. When formed from aluminum, the yield can be improved by employing a low temperature process. Oxide films of 10 to 30 nm thickness may be formed on the external surfaces of the gate electrodes if desired, for example, by anodic oxidation or another suitable method. An interlayer insulating film 204 is coated on the substrate. The insulating film 204 overlies the gate electrode to function as the gate insulating films of the first and second transistors 209 and 210.

Figure 12A:
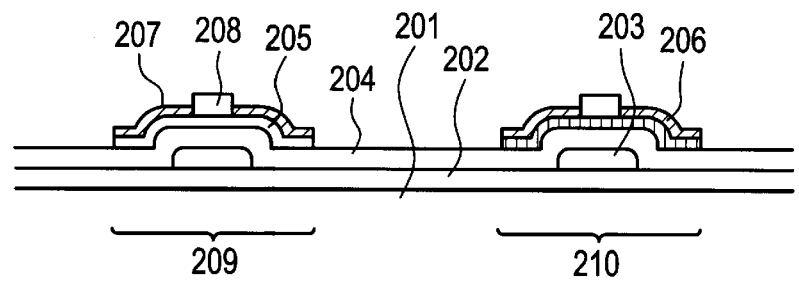
FIGS. 12(A) to 12(D) are cross sectional views showing a method of manufacturing an electro-optical liquid crystal display in accordance with the fourth embodiment of the present invention.
Figure 12B:
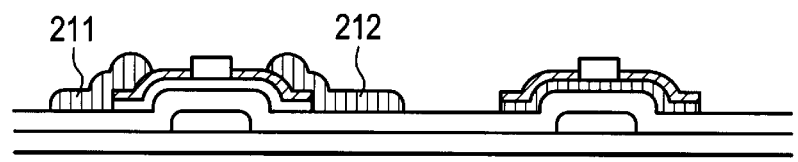

An intrinsic amorphous silicon semiconductor film 205 is formed over the gate electrode of the first transistor 209 to form active region. On the intrinsic semiconductor film 205 is formed an $n^+$ type microcrystalline silicon semiconductor film which is divided into source and drain regions 205 and 207 with an etching stopper 208 in between. For the second transistor 210, an n type semiconductor amorphous silicon semiconductor film 206 is formed over the gate electrode to form active region, followed by forming on the semiconductor film 206 an $n^+$ type microcrystalline silicon semiconductor film which is divided into source and drain regions with an etching stopper in the same manner. As a result, the first transistor is formed as an enhancement device and the second transistor as a depression device as shown in FIG. 12(A).

After forming a contact hole to provide an access to the gate electrode of the second transistor 210, a data line 211 and an wiring 212 are formed from a metal. The data line 211 is patterned to make contact with the drain region 207 of the first transistor 209 and the wiring 212 is patterned to connect the source region 206 of the first transistor 209 and the gate electrode of the second transistor 210 in the same manner as illustrated in FIG. 11(B).

Figure 12C:
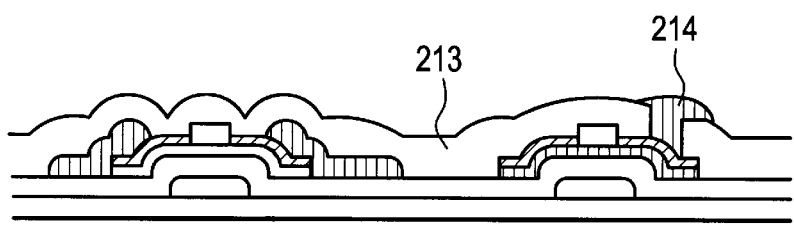
Figure 12D:
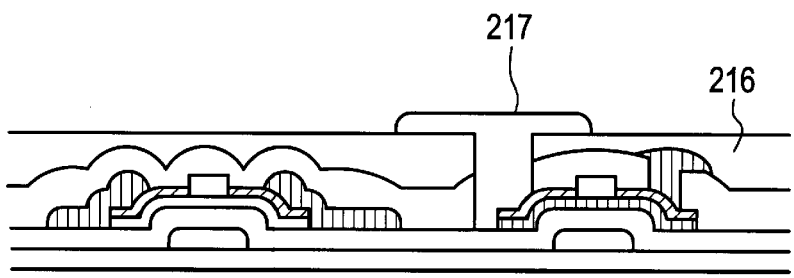

The structure is then coated with an interlayer insulating film 213. After a suitable contact hole is opened through the interlayer insulating film 213 at the drain of the second transistor 210, a voltage supplying line 214 are formed from a metal film by etching. The voltage supplying line 214 are connected through the contact hole to the drain of the second transistor 210 as illustrated in FIGS. 12(C). The upper surface of the structure is then coated with a surface smoothing film 216. After a suitable contact hole is opened through the smoothing film 216 at the source of the second transistor 210, an electrode pad 217 of the pixel is formed from a transparent conductive film such as an ITO film to make contact with the source of the second transistor 210 as illustrated in FIG. 12(D).

The fifth embodiment of the present invention shown in FIG. 7(A) can be formed in the same manner as illustrated in FIGS. 12(A) to 12(D). In this case, whereas both the active regions 205 and 206 are formed from an intrinsic semiconductor, the source and drain regions of the second semiconductor are formed from a $p^+$ type semiconductor. Since the mobility in a $p^+$ type amorphous semiconductor is very low, the transistors are desirably formed from a polysilicon semiconductor. Laser annealing is suitable for producing the polysilicon semiconductor at low temperatures because when aluminum is used to form the gate electrodes it tends to be degraded at temperatures no lower than 550.

Figure 13A:
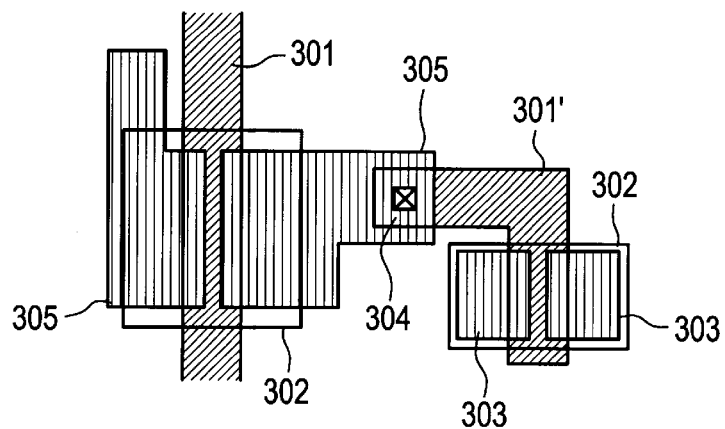
FIGS. 13(A) to 13(C) are plan views showing a method of manufacturing an electro-optical liquid crystal display in accordance with the fifth embodiment of the present invention.
Figure 13B:
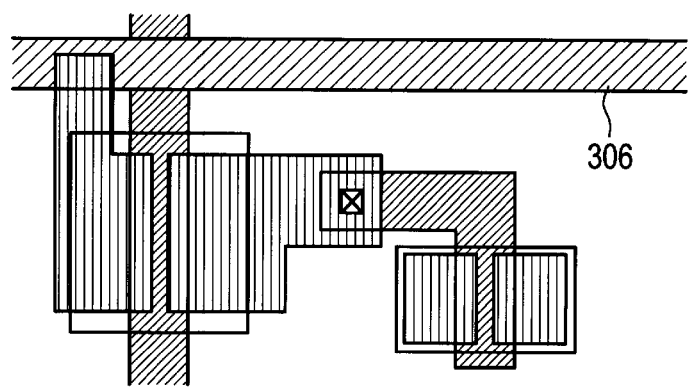
Figure 13C:
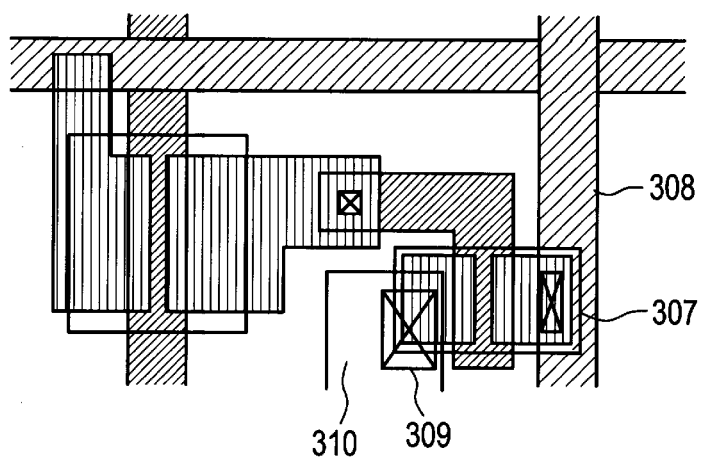

FIGS. 13(A) to 13(C) shows plan views of the circuit for supplying driving voltages in accordance with the fifth embodiment of the present invention in respective production steps.

A gate electrode 301 and a wiring 301' are patterned on a blocking film formed on a glass substrate in the same manner. The blocking film is made of silicon nitride for blocking movable ions such as sodium ions. The gate electrode 301 is formed to extend as an addressing line. These gate electrodes are preferably made of a metal such as aluminum or a semiconductor such as silicon. Oxide films of 10 to 30 nm thickness may be formed on the external surfaces of the gate electrodes if desired, for example, by anodic oxidation or another suitable method. After an interlayer insulating film is coated on the substrate as the gate insulating films of the first and second transistors, an intrinsic amorphous silicon semiconductor film 302 is formed and patterned to cover both the gate electrodes of the first and second transistor to form active regions. A contact hole 304 is opened through the insulating film. On the intrinsic semiconductor film 302 over the gate electrode of the first transistor is formed an $n^+$ type microcrystalline silicon semiconductor film 305 which is patterned into source and drain regions with an etching stopper (not shown). The source region 305 is connected to the gate electrode 301' of the second transistor through the contact hole 304. For the second transistor, $p^+$ type microcrystalline silicon semiconductor film 303 is formed on the intrinsic semiconductor film 303 and patterned into source and drain regions with an etching stopper in the same manner. As a result, CMOS devices comprising the first transistor and the second transistor as shown in FIG. 13(A) in completed.

A data line 211 is formed from a metal in order to make contact with the drain 305 of the first transistor. An interlayer insulating film is then formed over the structure and contact holes 307 and 309 are opened therethrough to provide accesses to the source and the drain of the second transistor. A voltage supplying line 308 is formed to make contact with the source of the second transistor. An electrode pad 310 of the pixel is formed to make contact with the drain of the second transistor.

This process can be applied for other embodiments of the present invention by suitably selecting the conductivity types of the respective semiconductors and making necessary modification if necessary. The respective steps of the above process to form the CMOS device are summarized as follows. The numbers in brackets [ ] are the mask number.

1) formation of the addressing line 301 and the gate electrode 301'[1],
2) formation of the gate insulating film (interlayer insulating film),
3) formation of the semiconductor film 302[2],
4) formation of the etching stoppers (not shown)[3],
5) formation of the contact hole 304[4],
6) formation of the semiconductor film 305[5],
7) formation of the semiconductor film 303[6],
8) formation of the data line 306[7],
9) formation of the interlayer insulating film,
10) formation of the contact holes 307 and 309[8],
11) formation of the voltage supplying line 308[9],
12) formation of the electrode pad 310 of the pixel[10].

Figure 14A:
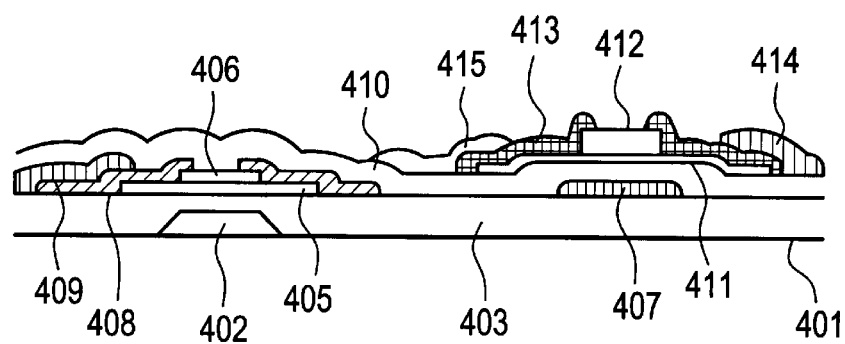
FIGS. 14(A) and 14(B) are a cross sectional view and a plan view showing an electro-optical liquid crystal display which can be manufactured without opening contact holes.
Figure 14B:
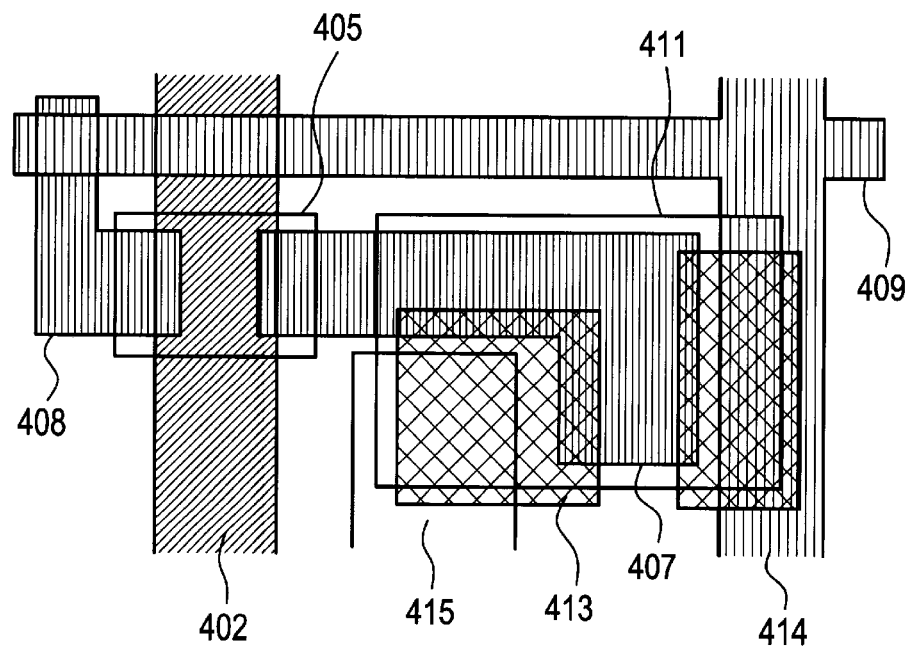

FIGS. 14(A) and 14(B) are a cross sectional view and a plan view showing the configuration of a device in accordance with the present invention which can be manufactured without opening contact holes.

An addressing line 408 is formed on a glass substrate 401. The addressing line functions as the gate electrode of the first transistor. The surface of the addressing line may be oxidized to form an oxide film of 10 to 200 nm thickness for example by anoding. An interlayer insulating film 403 is coated on the substrate over the addressing line and etched back to provide a flat upper surface. The interlayer insulating film 403 functions as the gate insulating film above the addressing line 402. The side surfaces of the addressing line may be tapered to avoid formation of sharp edges and improve the adhessivity to the interlayer insulating film 403. By this tapering, the upper width of the addressing line 408 is narrowed so that the channel length of the first transistor is decreased. This is advantageous because a lower resistance of the addressing line and a shorter channel length are always desired.

A semiconductor film 405 of 20 to 100 nm is formed to provide the active region of the first transistor. The film 405 is made of a polycrystalline silicon, an amorphous silicon or another silicon semiconductor of an intermediate crystalline state between them. A silicon nitride film is formed on the semiconductor film 405 and patterned as a channel stopper 406 to define a channel region in the underlying semiconductor film 405. The channel stopper 406 is particularly effective when the semiconductor film 405 is very thin and therefore tends to be easily damaged.

Next, an n+ type microcrystalline silicon semiconductor film is formed over the structure and patterned in order to provide a first pattern 407 extending as the gate electrode of the second transistor and as the source of the first transistor located over the right sides of the semiconductor film 405 and the stopper 406 as illustrated in FIG. 14(B) and a second pattern 408 extending over the lift sides of the semiconductor film 405 and the stopper 406 as the drain of the second transistor. In accordance with the present invention, since electric charge is accumulated in the source of the first transistor and the gate electrode of the second transistor, such an integrated structure of the source and the gate electrode is very advantageous. Then a data line 409 is formed from a metallic material in order to make contact with the second pattern 408.

After coating an interlayer insulating film 410 of silicon oxide over the structure, a semiconductor film 411 of 20 to 100 nm is formed to provide the active region of the second transistor. The film 411 is made of a polycrystalline silicon, an amorphous silicon or another silicon semiconductor of an intermediate crystalline state between them. A silicon nitride film is formed on the semiconductor film 411 and patterned as a channel stopper 412 to define a channel region in the underlying semiconductor film 411. Next, a p⁺ type microcrystalline silicon semiconductor film is formed over the structure and patterned in order to provide the source and the drain of the second transistor to provide a CMOS structure. A voltage supplying line 414 is formed to make contact with the source of the second transistor. An electrode pad 415 of the pixel is formed to make contact with the drain of the second transistor.

This process can be applied for other embodiments of the present invention by suitably selecting the conductivity types of the respective semiconductors and making necessary modification if necessary. The respective steps of the above process to form the CMOS device are summarized as follows. The numbers in brackets [ ] are the mask number.
1) formation of the addressing line 402[1],
2) formation of the gate insulating film (interlayer insulating film) 403,
3) formation of the semiconductor film 405[2],
4) formation of the etching stopper 406[3],
5) formation of the semiconductor films 407 and 408[4],
6) formation of the data line 409[5],
7) formation of the gate insulating film (interlayer insulating film) 410,
8) formation of the semiconductor film 411[5],
9) formation of the etching stopper 412[7],
10) formation of the semiconductor film 413[8],
11) formation of the voltage supplying line 414[9],
12) formation of the electrode pad of the pixel 415[10].

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A semiconductor device comprising:
a substrate having an insulating surface;
a first signal line extending over said substrate;
a first top-gate type thin film transistor having a channel region comprising crystalline silicon formed over said substrate wherein a gate of said first thin film transistor is connected to said first signal line;
a second signal line extending across said first signal line;
a second top-gate type thin film transistor having a channel region comprising crystalline silicon formed over said substrate wherein a gate of said second thin film transistor is electrically connected to said second signal line through at least said first thin film transistor;
a voltage supply line formed over said substrate;
a pixel electrode formed over said substrate wherein said pixel electrode is connected to said voltage supply line through at least said second thin film transistor; and
a peripheral circuit formed over said substrate for driving at least one of said first and second thin film transistors, said peripheral circuit comprising a third thin film transistor wherein a channel forming region of said third thin film transistor comprises a crystalline silicon,
wherein said first thin film transistor is an n-type transistor while said second thin film transistor is a p-type transistor.

2. A semiconductor device comprising:
a substrate having an insulating surface;
a first signal line extending over said substrate;
a first thin film transistor having a channel region comprising crystalline silicon formed over said substrate wherein a gate of said first thin film transistor is connected to said first signal line;
a second signal line extending across said first signal line;
a second thin film transistor having a channel region comprising crystalline silicon formed over said substrate wherein a signal is applied to a gate of said second thin film transistor from said second signal line through at least said first thin film transistor;
a voltage supply line formed over said substrate;
a pixel electrode formed over said substrate wherein said pixel electrode is supplied with a voltage from said voltage supply line through at least said second thin film transistor; and
a peripheral circuit formed over said substrate for driving at least one of said first and second thin film transistors, said peripheral circuit comprising a third thin film transistor wherein a channel forming region of said third thin film transistor comprises crystalline silicon,
wherein said first thin film transistor is an n-type transistor while said second thin film transistor is a p-type transistor.

3. A semiconductor device comprising:
a substrate having an insulating surface;
a first signal line extending over said substrate;
a first top-gate type thin film transistor having a channel region comprising crystalline silicon formed over said substrate wherein a gate of said first thin film transistor is connected to said first signal line;
a second signal line extending across said first signal line;
a second top-gate type thin film transistor having a channel region comprising crystalline silicon formed over said substrate wherein a gate of said second thin film transistor is electrically connected to said second signal line through at least said first thin film transistor;
a voltage supply line formed over said substrate;
a surface smoothing film formed over said first and second thin film transistors;
a pixel electrode formed over said surface smoothing film wherein said pixel electrode is connected to said voltage supply line through at least said second thin film transistor; and
a peripheral circuit formed over said substrate for driving at least one of said first and second thin film transistors, said peripheral circuit comprising a third thin film transistor wherein a channel forming region of said third thin film transistor comprises crystalline silicon,
wherein said first thin film transistor is an n-type transistor while said second thin film transistor is a p-type transistor.

4. A semiconductor device comprising:
a substrate having an insulating surface;
a first signal line extending over said substrate;
a first thin film transistor having a channel region comprising crystalline silicon formed over said substrate wherein a gate of said first thin film transistor is connected to said first signal line;
a second signal line extending across said first signal line;
a second thin film transistor having a channel region comprising crystalline silicon formed over said substrate wherein a signal is applied to a gate of said second thin film transistor from said second signal line through at least said first thin film transistor;

a voltage supply line formed over said substrate;

a surface smoothing film formed over said first and second thin film transistors;

a pixel electrode formed over said surface smoothing film wherein said pixel electrode is supplied with a voltage from said voltage supply line through at least said second thin film transistor; and a peripheral circuit formed over said substrate for driving at least one of said first and second thin film transistors, said peripheral circuit comprising a third thin film transistor wherein a channel forming region of said third thin film transistor comprises crystalline silicon, wherein said first thin film transistor is an n-type transistor while said second thin film transistor is a p-type transistor.

5. A semiconductor device comprising:

a substrate having an insulating surface;

a first signal line extending over said substrate;

a first top-gate type n-channel thin film transistor having a channel region comprising crystalline silicon and a first pair of impurity regions formed over said substrate wherein a gate of said first thin film transistor is connected to said first signal line;

a second signal line extending across said first signal line;

a second top-gate type p-channel thin film transistor having a channel region comprising crystalline silicon and a second pair of impurity regions formed over said substrate wherein a gate of said second thin film transistor is electrically connected to said second signal line through at least said first thin film transistor;

a voltage supply line formed over said substrate;

a pixel electrode formed over said substrate wherein said pixel electrode is connected to said voltage supply line through at least said second thin film transistor; and a peripheral circuit formed over said substrate for driving at least one of said first and second thin film transistors, said peripheral circuit comprising a third thin film transistor wherein a channel forming region of said third thin film transistor comprises crystalline silicon.

6. A semiconductor device comprising:

a substrate having an insulating surface;

a first signal line extending over said substrate;

a first n-channel thin film transistor having a channel region comprising crystalline silicon and a first pair of impurity regions formed over said substrate wherein a gate of said first n-channel thin film transistor is connected to said first signal line;

a second signal line extending across said first signal line;

a second p-channel thin film transistor having a channel region comprising crystalline silicon and a second pair of impurity regions formed over said substrate wherein a signal is applied to a gate of said second p-channel thin film transistor from said second signal line through at least said first thin film transistor;

a voltage supply line formed over said substrate;

a pixel electrode formed over said substrate wherein said pixel electrode is supplied with a voltage from said voltage supply line through at least said second p-channel thin film transistor; and a peripheral circuit formed over said substrate for driving at least one of said first and second thin film transistors, said peripheral circuit comprising a third thin film transistor wherein a channel forming region of said third thin film transistor comprises a crystalline silicon.

7. A semiconductor device comprising:

a substrate having an insulating surface;

a first signal line extending over said substrate;

a first top-gate type n-channel thin film transistor having a channel region comprising crystalline silicon and a first pair of impurity regions formed over said substrate wherein a gate of said first thin film transistor is connected to said first signal line;

a second signal line extending across said first signal line;

a second top-gate type p-channel thin film transistor having a channel region comprising crystalline silicon and a second pair of impurity regions formed over said substrate wherein a gate of said second thin film transistor is electrically connected to said second signal line through at least said first thin film transistor;

a voltage supply line formed over said substrate;

a surface smoothing film formed over said first and second thin film transistors;

a pixel electrode formed over said surface smoothing film wherein said pixel electrode is connected to said voltage supply line through at least said second thin film transistor; and a peripheral circuit formed over said substrate for driving at least one of said first and second thin film transistors, said peripheral circuit comprising a third thin film transistor wherein a channel forming region of said third thin film transistor comprises crystalline silicon.

8. A semiconductor device comprising:

a substrate having an insulating surface;

a first signal line extending over said substrate;

a first n-channel thin film transistor having a channel region comprising crystalline silicon and a first pair of impurity regions formed over said substrate wherein a gate of said first thin film transistor is connected to said first signal line;

a second signal line extending across said first signal line;

a second p-channel thin film transistor having a channel region comprising crystalline silicon and a second pair of impurity regions formed over said substrate wherein a signal is applied to a gate of said second p-channel thin film transistor from said second signal line through at least said first thin film transistor;

a voltage supply line formed over said substrate;

a surface smoothing film formed over said first and second thin film transistors;

a pixel electrode formed over said surface smoothing film wherein said pixel electrode is supplied with a voltage from said voltage supply line through at least said second thin film transistor; and a peripheral circuit formed over said substrate for driving at least one of said first and second thin film transistors, said peripheral circuit comprising a third thin film transistor wherein a channel forming region of said third thin film transistor comprises a crystalline silicon.

9. The device according to any one of claims 1,2,3,4,5,6,7 or 8 wherein said first signal line extends in parallel with said voltage supply line.

10. The device according to any one of claims 1,2,3 or 4 wherein said second signal line is connected to a drain of said first thin film transistor, said voltage supply line is connected to a drain of said second thin film transistor, and said pixel electrode is connected to a source of said second thin film transistor.

11. The device according to any one of claims 5, 6, 7 or 8 wherein said second signal line is connected to one of said first pair of impurity regions of said first thin film transistor, said voltage supply line is connected to one of said second pair of impurity regions of said second thin film transistor, and said pixel electrode is connected to the other one of said second pair of impurity regions of said second thin film transistor.

12. A semiconductor device comprising:

a substrate having an insulating surface;

a first top-gate type n-channel thin film transistor having a channel region comprising crystalline silicon and a first pair of impurity regions formed over said substrate;

a second top-gate type p-channel thin film transistor having a channel region comprising crystalline silicon and a second pair of impurity regions formed over said substrate wherein a gate of said second thin film transistor is electrically connected to one of the impurity regions of said first thin film transistor;

a voltage supply line formed over said substrate;

a pixel electrode formed over said substrate wherein said pixel electrode is connected to said voltage supply line through at least said second thin film transistor; and a peripheral circuit formed over said substrate for driving at least one of said first and second thin film transistors, said peripheral circuit comprising a third thin film transistor wherein a channel forming region of said third thin film transistor comprises a crystalline silicon.

13. A semiconductor device comprising:

a substrate having an insulating surface;

a first n-channel thin film transistor having a channel region comprising crystalline silicon and a first pair of impurity regions formed over said substrate;

a second p-channel thin film transistor having a channel region comprising crystalline silicon and a second pair of impurity regions formed over said substrate wherein a gate of said second thin film transistor is connected to one of the impurity regions of said first thin film transistor;

a voltage supply line formed over said substrate;

a pixel electrode formed over said substrate wherein said pixel electrode is supplied with a voltage from said voltage supply line through at least said second thin film transistor; and a peripheral circuit formed over said substrate for driving at least one of said first and second thin film transistors, said peripheral circuit comprising a third thin film transistor wherein a channel forming region of said third thin film transistor comprises crystalline silicon.

14. A semiconductor device comprising:

a substrate having an insulating surface;

a first top-gate type n-channel thin film transistor having a channel region comprising crystalline silicon and a first pair of impurity regions formed over said substrate;

a second top-gate type p-channel thin film transistor having a channel region comprising crystalline silicon and a second pair of impurity regions formed over said substrate wherein a gate of said second thin film transistor is electrically connected to one of the impurity regions of said first thin film transistor;

a voltage supply line formed over said substrate;

a surface smoothing film formed over said first and second thin film transistors;

a pixel electrode formed over said surface smoothing film wherein said pixel electrode is connected to said voltage supply line through at least said second thin film transistor; and a peripheral circuit formed over said substrate for driving at least one of said first and second thin film transistors, said peripheral circuit comprising a third thin film transistor wherein a channel forming region of said third thin film transistor comprises crystalline silicon.

15. A semiconductor device comprising:

a substrate having an insulating surface;

a first n-channel thin film transistor having a channel region comprising crystalline silicon and a first pair of impurity regions formed over said substrate;

a second p-channel thin film transistor having a channel region comprising crystalline silicon and a second pair of impurity regions formed over said substrate wherein a gate of said second thin film transistor is electrically connected to one of the impurity regions of said first thin film transistor;

a voltage supply line formed over said substrate;

a surface smoothing film formed over said first and second thin film transistors;

a pixel electrode formed over said surface smoothing film wherein said pixel electrode is supplied with a voltage from said voltage supply line through at least said second thin film transistor; and a peripheral circuit formed over said substrate for driving at least one of said first and second thin film transistors, said peripheral circuit comprising a third thin film transistor wherein a channel forming region of said third thin film transistor comprises crystalline silicon.

16. A semiconductor device comprising:

a substrate having an insulating surface;

a first top-gate type n-channel thin film transistor having a channel region comprising crystalline silicon and a first pair of impurity regions formed over said substrate;

a second top-gate type p-channel thin film transistor having a channel region comprising crystalline silicon and a second pair of impurity regions formed over said substrate wherein a gate of said second thin film transistor is electrically connected to one of the impurity regions of said first thin film transistor;

a voltage supply line formed over said substrate;

a pixel electrode formed over said substrate wherein said pixel electrode is connected to said voltage supply line through at least said second thin film transistor; and a peripheral circuit formed over said substrate for driving at least one of said first and second thin film transistors, said peripheral circuit comprising a third thin film transistor wherein a channel forming region of said third thin film transistor comprises crystalline silicon.

17. A semiconductor device comprising:

a substrate having an insulating surface;

a first n-channel thin film transistor having a channel region comprising crystalline silicon and a first pair of impurity regions formed over said substrate;

a second p-channel thin film transistor having a channel region comprising crystalline silicon and a second pair of impurity regions formed over said substrate wherein a gate of said second thin film transistor is connected to one of the impurity regions of said first thin film transistor;

a voltage supply line formed over said substrate;

a pixel electrode formed over said substrate wherein said pixel electrode is supplied with a voltage from said voltage supply line through at least said second thin film transistor; and a peripheral circuit formed over said substrate for driving at least one of said first and second thin film transistors, said peripheral circuit comprising a third thin film transistor wherein a channel forming region of said third thin film transistor comprises crystalline silicon.

18. A semiconductor device comprising:

a substrate having an insulating surface;

a first top-gate type n-channel thin film transistor having a channel region comprising crystalline silicon and a first pair of impurity regions formed over said substrate;

a second top-gate type p-channel thin film transistor having a channel region comprising crystalline silicon and a second pair of impurity regions formed over said substrate wherein a gate of said second thin film transistor is electrically connected to one of the impurity regions of said first thin film transistor;

a voltage supply line formed over said substrate;

a surface smoothing film formed over said first and second thin film transistors;

a pixel electrode formed over said surface smoothing film wherein said pixel electrode is connected to said voltage supply line through at least said second thin film transistor; and a peripheral circuit formed over said substrate for driving at least one of said first and second thin film transistors, said peripheral circuit comprising a third thin film transistor wherein a channel forming region of said third thin film transistor comprises crystalline silicon.

19. A semiconductor device comprising:

a substrate having an insulating surface;

a first n-channel thin film transistor having a channel region comprising crystalline silicon and a first pair of impurity regions formed over said substrate;

a second p-channel thin film transistor having a channel region comprising crystalline silicon and a second pair of impurity regions formed over said substrate wherein a gate of said second thin film transistor is electrically connected to one of the impurity regions of said first thin film transistor;

a voltage supply line formed over said substrate;

a surface smoothing film formed over said first and second thin film transistors;

a pixel electrode formed over said surface smoothing film wherein said pixel electrode is supplied with a voltage supply line through at least said second thin film transistor; and a peripheral circuit formed over said substrate for driving at least one of said first and second thin film transistors, said peripheral circuit comprising a third thin film transistor wherein a channel forming region of said third thin film transistor comprises crystalline silicon.

* * * * *

UNITED STATES PATENT AND TRADEMARK OFFICE
CERTIFICATE OF CORRECTION

PATENT NO.        : 6,759,680 B1
APPLICATION NO. : 09/453402
DATED             : July 6, 2004
INVENTOR(S)       : Yasuhiko Takemura It is certified that error appears in the above-identified patent and that said Letters Patent is hereby corrected as shown below:

On page 2 of the patent, under "FOREIGN PATENT DOCUMENTS," after "EP 0 342 925" replace "12/1994" with --11/1989--.
Column 1, line 65, replace "microseconds" with --microsecond--.
Column 2, lines 7 and 36, replace ""V" with --$\Delta V$--.
Column 2, line 23, replace "volts" with --volt--.
Column 2, lines 24 and 51, replace "in future" with --in the future--.
Column 2, line 37, replace "gradually" with --a gradual--.
Column 2, line 44, replace "t1" with --$t_1$--.
Column 2, line 56, replace "10% of" with --10% or--.
Column 2, line 66, replace "gradually" with --gradual--.
Column 3, line 1, replace "width, the" with --width, and the-- and replace "region, of" with --region, and of--.
Column 3, line 12, replace "signals" with --signal--.
Column 3, line 25, replace "are" with --is--.
Column 3, line 43, replace "seems" with --seem--.
Column 3, line 48, replace "signal" with --signals--.
Column 3, line 55, replace "takes" with --take--.
Column 4, lines 5 and 9, replace "object" with --objects--.
Column 5, line 1, replace "$V_D$" with --$V_G$--.
Column 5, line 16, replace "O" with --0--.
Column 5, line 29, replace "than tenth" with --than a tenth--.
Column 5, line 30, replace "hundredth" with --hundredths of--.
Column 5, line 56, replace "semiconductors" with --semiconductor--.
Column 6, line 26, replace "massproduction" with --mass production--.
Column 6, line 39, replace "32/32" with --33/32--.
Column 6, line 62, replace "O" with --0--.
Column 7, line 23, replace "Nos.Hei3-183870" with --Nos.Hei3-163870--.
Column 7, line 24, replace "183873" with --163873-- and replace "later" with --latter--.
Column 7, line 38, replace "with in" with --within--.
Column 7, line 42, replace "slightly" with --slight--.
Column 7, line 46, replace "some" with --one--.
Column 8, line 42, "Furthermore, broken" with --Furthermore, a broken--.
Column 8, line 53, replace "by broken" with --by a broken--.
Column 8, line 54, replace "arise" with --arises--.
Column 8, line 57, replace "with broken" with --with a broken--.
Column 9, line 8, replace "no" with --a--.
Column 9, line 20, replace "more large" with --larger--.
Column 9, line 54, replace "15" with --16--.
Column 10, line 61, replace "Z" with --2--.

UNITED STATES PATENT AND TRADEMARK OFFICE
CERTIFICATE OF CORRECTION

PATENT NO. : 6,759,680 B1
APPLICATION NO. : 09/453402
DATED : July 6, 2004
INVENTOR(S) : Yasuhiko Takemura It is certified that error appears in the above-identified patent and that said Letters Patent is hereby corrected as shown below:

Column 11, line 15, replace "details" with --detail--.
Column 11, line 64, replace "detailedly explained also" with --also explained in detail--.
Column 11, line 66, replace "signals" with --signal--.
Column 11, line 67, replace "line" with --lines--.
Column 12, line 10, replace "are" with --is--.
Column 12, line 23, replace "$V_G$'" with --$V_{G'}$--.
Column 12, lines 28 and 40, replace "$V_G$," with --$V_{G'}$--.
Column 12, lines 30, 33, 41 and 42, replace "$Tr_1$," with --$Tr_{1'}$--.
Column 12, line 34, replace "$Tr_2$'" with --$Tr_{2'}$--.
Column 12, line 36, replace "Tr1'" with --$Tr_{1'}$--.
Column 12, line 37, replace "$V_2$," with --$V_{2'}$--.
Column 12, line 41, replace "transmit" with --transmits--.
Column 12, line 43, replace "$Tr_2$," with --$Tr_{2'}$--.
Column 12, line 45, replace "broken" with --a broken-- and replace "Tr2'," with -- $Tr_{2'}$,--.
Column 12, line 46, replace "$V_1$," with --$V_{1'}$--.
Column 12, line 48, replace "$V_2$," with --$V_{2'}$--.
Column 12, lines 49 and 55, replace "with broken" with --with a broken--.
Column 13, line 2, replace "faster" with --fast--.
Column 13, line 56, replace "$T_1$" with --$Tr_1$--.
Column 13, line 60, replace "Such a trouble" with --Such trouble--.
Column 14, line 7, replace "data" with --addressing--.
Column 14, line 10, replace "$T_3$" with --$Tr_3$--.
Column 14, line 40, replace "$T_2$" with --$Tr_2$--.
Column 14, line 42, replace "FIG. 8(B)" with --FIG. 6(B)--.
Column 14, line 53, replace "–5V" with ---8V--.
Column 14, line 59, replace "with broken" with --with a broken--.
Column 15, line 4, replace "an" with --a--.
Column 15, line 23, replace "with broken" with --with a broken--.
Column 15, line 32, replace "is" with --are--.
Column 15, line 36, replace "FIG. 6" with --FIG. 8--.
Column 15, lines 38, 43 (two occurrences), 44 (two occurrences), 52, 55, 58, 62 and 67, replace "To" with --$T_0$--.
Column 15, line 59, replace "$Tr_g$" with --$Tr_2$--.
Column 15, line 64, replace "Tc" with --$T_0$--.
Column 16, lines 3, 5 (two occurrences), 6, 9, 15, 24, 31, 42 and 43, replace "To" with --$T_0$--.
Column 16, line 4, replace "for total" with --for a total--.
Column 16, line 7, replace "SiTo" with "31$T_0$--.
Column 16, line 14, replace "0.88" with --0.98--.

UNITED STATES PATENT AND TRADEMARK OFFICE
CERTIFICATE OF CORRECTION

PATENT NO. : 6,759,680 B1
APPLICATION NO. : 09/453402
DATED : July 6, 2004
INVENTOR(S) : Yasuhiko Takemura It is certified that error appears in the above-identified patent and that said Letters Patent is hereby corrected as shown below:

Column 16, line 15, replace "Exactly saying," with --Stated exactly,--.
Column 16, line 18, replace "18 To" with --16 $T_0$--.
Column 16, line 35, replace "of 30" to --of a 30--.
Column 16, line 36, replace "microseconds" with --microsecond--.
Column 16, line 37, replace "arise" with --arises--.
Column 16, line 43, replace "operated" with --operates--.
Column 16, line 65, replace "ICs for" with --ICs 904 for--.
Column 16, line 66, replace "ICs for" with --ICs 905 for--.
Column 17, line 1, replace "panel is" with --panel 902 is--.
Column 17, line 2, replace "by broken" with --by a broken--.
Column 17, line 3, replace "comprises" with --comprise--.
Column 17, line 5, replace "ICs mounted" with --ICs 903 mounted--.
Column 17, line 13, replace "method" with --methods--.
Column 17, lines 24-25 and 26, replace "designate" with --designates--.
Column 17, line 26, replace "details" with --detail--.
Column 18, line 1, replace "112" with --113--.
Column 18, line 17, replace "methods" with --method--.
Column 18, line 21, replace "FIG. 8(A)" with --FIG. 6(A)-- and replace "109" with --209--.
Column 18, lines 43 and 49, replace "form active" with --form an active--.
Column 18, line 58, replace "an" with --a--.
Column 18, line 61, replace "206" with --205--.
Column 18, line 67, replace "are" with --is--.
Column 19, line 1, replace "are" with --is--.
Column 19, line 3, replace "FIGS." with --FIG.--.
Column 19, line 23, replace "shows" with --show--.
Column 19, line 51, replace "303" with --302--.
Column 19, line 54, change "completed" to --completed form--.
Column 20, line 2, replace "number" with --numbers--.
Column 20, lines 21 and 32, replace "408" with --402--.
Column 20, line 31, replace "adhessivity" with --adhesiveness--.
Column 20, line 47, replace "n+" with --$n^+$--.
Column 21, line 16, replace "number" with --numbers--.

UNITED STATES PATENT AND TRADEMARK OFFICE
CERTIFICATE OF CORRECTION

| | | |
|---|---|---|
| PATENT NO. | : 6,759,680 B1 | |
| APPLICATION NO. | : 09/453402 | |
| DATED | : July 6, 2004 | |
| INVENTOR(S) | : Yasuhiko Takemura | |

It is certified that error appears in the above-identified patent and that said Letters Patent is hereby corrected as shown below:

Column 21, line 26, replace "411[5]" with --411[6]--.

Signed and Sealed this

First Day of May, 2007

JON W. DUDAS
*Director of the United States Patent and Trademark Office*